US008877630B1

(12) United States Patent
Cheng et al.

(10) Patent No.: US 8,877,630 B1
(45) Date of Patent: Nov. 4, 2014

(54) SEMICONDUCTOR STRUCTURE HAVING A SILVER ALLOY BUMP BODY AND MANUFACTURING METHOD THEREOF

(71) Applicant: ChipMos Technologies Inc., Hsinchu (TW)

(72) Inventors: Shih Jye Cheng, Hsinchu (TW); Tung Bao Lu, Hsinchu (TW)

(73) Assignee: ChipMos Technologies Inc., Hsinchu (TW)

( * ) Notice: Subject to any disclaimer, the term of this patent is extended or adjusted under 35 U.S.C. 154(b) by 0 days.

(21) Appl. No.: 14/078,240

(22) Filed: Nov. 12, 2013

(51) Int. Cl.
*H01L 21/44* (2006.01)
*H01L 23/00* (2006.01)
*H01L 21/48* (2006.01)

(52) U.S. Cl.
CPC .............. *H01L 21/4853* (2013.01); *H01L 24/11* (2013.01)
USPC ............................ 438/613; 205/253; 205/263

(58) Field of Classification Search
CPC .................................... C25D 3/56; C25D 3/46
USPC ................................... 438/613; 205/253, 263
See application file for complete search history.

(56) References Cited

U.S. PATENT DOCUMENTS

| | | | | |
|---|---|---|---|---|
| 5,516,412 A | * | 5/1996 | Andricacos et al. | 204/224 R |
| 5,829,125 A | | 11/1998 | Fujimoto et al. | |
| 5,973,405 A | * | 10/1999 | Keukelaar et al. | 257/780 |
| 6,040,702 A | * | 3/2000 | Hembree et al. | 324/756.05 |
| 6,144,103 A | * | 11/2000 | Miller et al. | 257/781 |
| 6,313,651 B1 | * | 11/2001 | Hembree et al. | 324/756.02 |
| 7,012,333 B2 | * | 3/2006 | Shimoyama et al. | 257/737 |
| 8,193,636 B2 | * | 6/2012 | Lee et al. | 257/736 |
| 2004/0253804 A1 | * | 12/2004 | Beica et al. | 438/614 |
| 2005/0155706 A1 | * | 7/2005 | Nishida et al. | 156/312 |
| 2005/0224974 A1 | * | 10/2005 | Nishida et al. | 257/737 |
| 2007/0013067 A1 | * | 1/2007 | Nishida et al. | 257/737 |
| 2007/0037377 A1 | * | 2/2007 | Richardson et al. | 438/613 |
| 2007/0218676 A1 | | 9/2007 | Wang et al. | |
| 2008/0230896 A1 | * | 9/2008 | Zhong et al. | 257/737 |
| 2010/0216302 A1 | * | 8/2010 | Luo et al. | 438/613 |
| 2011/0031113 A1 | * | 2/2011 | Lopatin et al. | 204/252 |
| 2011/0233745 A1 | * | 9/2011 | Fee et al. | 257/673 |
| 2011/0266669 A1 | * | 11/2011 | Chou et al. | 257/737 |
| 2012/0032338 A1 | * | 2/2012 | Komori | 257/773 |
| 2012/0138471 A1 | * | 6/2012 | Mayer et al. | 205/170 |
| 2012/0151764 A1 | * | 6/2012 | Furuta et al. | 29/847 |
| 2012/0228681 A1 | * | 9/2012 | Lin et al. | 257/290 |
| 2012/0325671 A2 | * | 12/2012 | Keigler et al. | 205/118 |
| 2013/0206602 A1 | * | 8/2013 | Lee et al. | 205/253 |
| 2013/0256145 A1 | * | 10/2013 | Romer et al. | 205/253 |

FOREIGN PATENT DOCUMENTS

JP          58176969 A   * 10/1983   .............. H01L 29/46

* cited by examiner

*Primary Examiner* — Caleb Henry
(74) *Attorney, Agent, or Firm* — WPAT, P.C; Anthony King

(57) ABSTRACT

The present disclosure provides a method for manufacturing a semiconductor structure. The method includes forming a conductive pad on a semiconductor die; forming a seed layer over the conductive pad; defining a first mask layer over the seed layer; and forming a silver alloy bump body in the first mask layer. The forming a silver alloy bump body in the first mask layer includes operations of preparing a first cyanide-based bath; controlling a pH value of the first cyanide-based bath to be within a range of from about 6 to about 8; immersing the semiconductor die into the first cyanide-based bath; and applying an electroplating current density of from about 0.1 ASD to about 0.5 ASD to the semiconductor die.

6 Claims, 26 Drawing Sheets

SEMICONDUCTOR STRUCTURE HAVING A SILVER ALLOY BUMP BODY AND MANUFACTURING METHOD THEREOF

FIELD

The disclosure relates to a semiconductor structure and the manufacturing method thereof.

BACKGROUND

With the recent advancement of the electronics industry, electronic components are being developed to have high performance and thus there is a demand for miniaturized and highly-densified packages. Accordingly, interposers which functions to connect ICs to a main board must be packed more densely. The high densification of packages is attributable to an increase of the number of I/Os of ICs, and the method for the connection with the interposers has also been made more efficient The growing popularity of one of the interposer technology is flip-chip bonding. Flip-chip assembly in the fabrication process flow of silicon integrated circuit (IC) devices is driven by several facts. First, the electrical performance of the semiconductor devices can be improved when the parasitic inductances correlated with conventional wire bonding interconnection techniques are reduced. Second, flip-chip assembly provides higher interconnection densities between chip and package than wire bonding. Third, flip-chip assembly consumes less silicon "real estate" than wire bonding, and thus helps to conserve silicon area and reduce device cost. And fourth, the fabrication cost can be reduced, when concurrent gang-bonding techniques are employed rather than consecutive individual bonding steps.

In order to reduce interposer's size and its pitch, efforts were undertaken to replace the earlier solder-based interconnecting balls in flip-chip bonding with metal bumps, especially by an effort to create metal bumps by a modified wire ball technique. Typically, the metal bumps are created on an aluminum layer of the contact pads of semiconductor chips. Subsequently, the chips are attached to substrates using solder. The metal bumps are used for flip chip packaging with applications for LCDs, memories, microprocessors and microwave RFICs.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
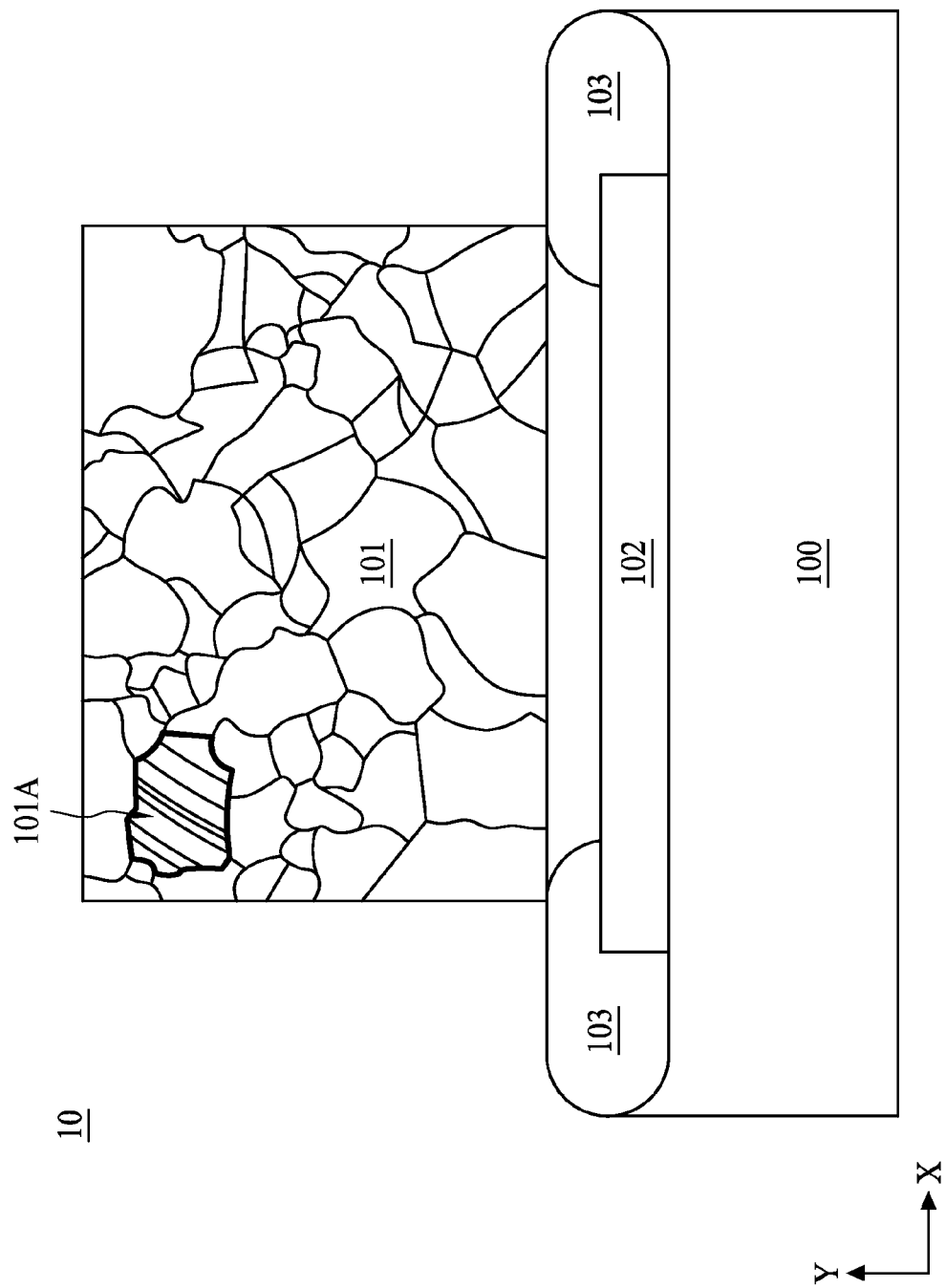
FIG. 1 is a cross sectional view of a silver alloy bump structure in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Among the metal bump technology in semiconductor packaging, gold bumps gained most popularity in that the familiarity to the material properties and processing technology in the art. However, high material cost, inferior bonding reliability and unsatisfactory material properties such as low electrical conductivity and low thermal conductivity remain as problems to be solved. An alternative cost-saving approach to fabricate metal bump is by creating multilayer bumps, for example, a Cu (bottom layer), Ni (middle layer) and Au (top layer) bump. This approach saves the gold material consumption for a metal bump but the Cu bottom layer is subject to easy oxidation and corrosion, and thus generates reliability concerns.

When the gold bumps are joined to the substrate pads by reflowing the solder that has been deposited on the pads, a number of gold/tin intermetallics are formed. Because of the high dissolution rate of gold in the molten solders, the solder joints with gold bumps have, after one reflow, a large volume fraction of intermetallic compounds, with $AuSn_4$ the major phase that greatly embrittle the joints. After two or more reflows, which are typically needed for assembling package-on-package products, the gold bumps may be completely consumed and converted into gold/tin intermetallic compounds. Because of the brittleness of these compounds and the direct contact of the intermetallics with the aluminum pad on the chip side, the joints frequently fail reliability tests such as the mechanical drop test by cracking at the bump/chip interface.

Silver bump is one twentieth of the cost of the gold bump, and silver bump possesses the highest electrical conductivity and the highest thermal conductivity of the three metals discussed herein (Au, Cu, Ag). In addition, the annealing temperature of the silver bump is lower than that of the gold bump, thus greatly reduce the risk of passivation crack. As far as solder-joint the silver bump to a substrate is concerned, at a temperature higher than the eutectic temperature, silver/tin interface demonstrates a superior bonding property than that of the gold/tin interface. In some embodiments of the present disclosure, silver alloy is utilized for silver bump to avoid silver needle, silver migration, oxidation and vulcanization problems inherent to pure silver.

Methods for electroplating articles with metal coatings generally involve passing a current between two electrodes in a plating solution, where one of the electrodes (typically the cathode) is the article to be plated. A typical silver or silver-alloy plating solution comprises dissolved silver ion, water, optionally one or more dissolved alloying metals such as tin or copper, an acid electrolyte such as methanesulfonic acid in an amount sufficient to impart conductivity to the bath, and proprietary additives to improve the uniformity of the plating and the quality of the metal deposit. Such additives include complexers, surfactants, and grain refiners, among others.

Some embodiments of the present disclosure provide a method for manufacturing a semiconductor structure. The method includes operations of forming a conductive pad on a semiconductor die; forming a seed layer over the conductive pad; defining a first mask layer over the seed layer; and forming a silver alloy bump body in the first mask layer. The operation of forming a silver alloy bump body in the first mask layer includes preparing a first cyanide-based bath; controlling a pH value of the first cyanide-based bath to be within a range of from about 6 to about 8; immersing the semiconductor die into the first cyanide-based bath; and applying an electroplating current density of from about 0.1 ASD to about 0.5 ASD to the semiconductor die.

Some embodiments of the present disclosure provide a method for manufacturing a chip-on-film (COF) semiconductor structure. The method includes forming a conductive pad on a semiconductor die; forming a seed layer over the conductive pad; forming a silver alloy bump body over the seed layer; and bonding the silver alloy bump body to a flexible film. The operation of forming a silver alloy bump body over the seed layer further includes preparing a cyanide-based bath comprising at least one of $KAu(CN)_2$, $KAg(CN)_2$, and $K_2Pd(CN)_4$ at a solution temperature of from about 40 to about 50 degrees Celsius; controlling a pH value of the cyanide-based bath within a range of from about 6 to about 8; and immersing the semiconductor die into the cyanide-based bath; and applying an electroplating current density of from about 0.1 ASD to about 0.5 ASD to the semiconductor die.

Some embodiments of the present disclosure provide a method for manufacturing a chip-on-glass (COG) semiconductor structure. The method includes forming a conductive pad on a semiconductor die; forming a seed layer over the conductive pad; forming a silver alloy bump body over the seed layer; and bonding the silver alloy bump body to a glass substrate. The forming a silver alloy bump body over the seed layer further includes preparing a cyanide-based bath comprising at least one of $KAu(CN)_2$, $KAg(CN)_2$, and $K_2Pd(CN)_4$; controlling a pH value of the cyanide-based bath is within a range of from about 6 to about 8; and immersing the semiconductor die into the cyanide-based bath; and applying an electroplating current density of from about 0.1 ASD to about 0.5 ASD to the semiconductor die.

DEFINITIONS

In describing and claiming the present disclosure, the following terminology will be used in accordance with the definitions set forth below. As used herein, the following abbreviations shall have the following meanings, unless the context clearly indicates otherwise: ASD: $A/dm^2$=amperes per square decimeter; ° C.: degrees Centigrade; g: gram; mg: milligram; L: liter; A: angstroms; µm: microns=micrometers; mm: millimeters; min: minutes; Dl: Defendants' Evidence de-ionized; and mL: milliliter. All amounts are percent by weight ("wt %") and all ratios are molar ratios, unless otherwise noted. All numerical ranges are inclusive and combinable in any order, except where it is clear that such numerical ranges are constrained to add up to 100%.

As used herein, an "average grain size" is measured by any conventional grain size measurement techniques such as X-ray diffraction (XRD), electron beam scattering pattern (EBSP), transmission electron microscopy (TEM), or scanning electron microscopy (SEM). A pretreated cross sectional plane of the sample is prepared for the grain size measurements discussed in this disclosure. FIG. 1 shows a cross section of a silver alloy bump structure 10 with a silver alloy bump body 101 connected to a conductive pad 102, and both the silver alloy bump body 101 and the conductive pad 102 are positioned on a device 100. A longitudinal direction of the silver alloy bump structure 10 is parallel to the Y direction. In other words, the longitudinal direction refers to the direction perpendicular to a surface accommodating the silver alloy bump body 101 and the conductive pad 102. The cross sectional planes subjected to any of the measurements discussed herein is any planes passing through the silver alloy bump body 101 having a plane normal perpendicular to the longitudinal direction.

As used herein, an "electron beam scattering pattern (EBSP)" used for average grain size measurement is aided by a computer analysis program (for example, TSL OIM analysis). The setting of the computer analysis program includes, but not limited to, grain boundary misorientation of 15 degrees, CI value equal to or greater than 0.1, and minimal grain size of at least 5 testing points. In some embodiments. The average grain size of the EBSP measurement is obtained by averaging the grain sizes on at least three different testing locations of the cross sectional plane. A predetermined area is measured in each testing location. The predetermined area varies in accordance with features of different embodiments. Each testing location is at least 1 mm away from the adjacent testing location. In some embodiments, an interval between each measuring points in one testing location is at least 5 nm.

In some embodiments, the prepared sample subjected to the EBSP measurement is observed under an accelerating voltage of 20 kV and a magnification of 100× to 500×. In some embodiments, the prepared sample is positioned at a tilting angle of 70 degrees. As used herein, "transmission electron microscopy (TEM), or scanning electron microscopy (SEM)" used for average grain size measurement is aided by an image analysis program (for example, CLEMEX Vision PE). In some embodiments. The average grain size of the TEM or SEM measurement is obtained by averaging the grain sizes on at least three different testing locations of the cross sectional plane. A predetermined area is measured in each testing location. The predetermined area varies in accordance with features of different embodiments. Each testing location is at least 1 mm away from the adjacent testing location. In some embodiments, the interval between each measuring points in one testing location is at least 5 µm. In some embodiments, the prepared sample subjected to the TEM or SEM measurement is observed under an accelerating voltage of about 5 kV to about 20 kV and a magnification of 100× to 500×.

As used herein, "standard deviation of grain size distribution" of the silver alloy bump refers to a statistical result which is obtained using an image analysis program discussed herein. After obtaining a dispersion curve of the grain size distribution, one standard deviation is defined as a grain size deviated from a mean grain size (expectation value), wherein the number of the grain having a grain size between the deviated grain size and the mean grain size is accountable for 34% of the total number of grains.

FIG. 1 is a cross section of a silver alloy bump structure 10 with a silver alloy bump body 101 connected to a conductive pad 102. The silver alloy bump body 101 and the conductive pad 102 are positioned on a device 100. In some embodiments, the device 100 includes, but not limited to, active devices such as a memory, a transistor, a diode (PN or PIN junctions), integrated circuits, or a varactor. In other embodiments, the device 100 includes passive devices such as a resistor, a capacitor, or an inductor. As shown in FIG. 1, only a microstructure of the silver alloy bump body 101 is shown. A cross section of the silver alloy bump body 101 is prepared by cutting the silver alloy bump structure 10 along a longitudinal direction (Y direction) and an XY surface is obtained. Using an electronic microscope, grain structure of the silver alloy bump body 101 is identified on the cross sectional plane, and with a help of image analysis software discussed herein, the statistical information of the grain size distribution can be obtained.

Referring to FIG. 1, an area of a grain 101A is shaded with straight lines. The SEM picture shown in the silver alloy bump body 101 is taken from a real cross sectional plane of the silver alloy bump body 101 described herein. In some embodiments, because the silver alloy bump body 101 is formed by an electroplating operation, grain size distribution is rather uniform and no heat-affected zone (HAZ) is observed as those in a stud bump (not shown). HAZ produces abrupt change in the grain size due the fact that the grain growth procedure is subject to a local high temperature. Normally the grain size obviously increases in the HAZ. In some embodiments of the present disclosure, sub-grain structures can be identified in the grains of the silver alloy bump body 101. For example, in the grain 101A, sub-grain domains are visible in a way that several regions within the grain 101A separated by domain boundaries can be identified.

In some embodiments, the silver alloy bump body 101 includes $Ag_{1-x}Y_x$ alloy. Specie Y in the $Ag_{1-x}Y_x$ alloy includes metal forming complete solid solution with silver at arbitrary weight percentage. In some embodiments, specie Y can be identified by looking at a binary phase diagram. A liquidus line and a solidus line forming a lens shape in a binary phase diagram indicate a complete mix of solid solution at any composition of the two metal components. For example, in some embodiments of the present disclosure, specie Y is gold, palladium, or the combination thereof. In some embodiments, the content of the specie Y in the $Ag_{1-x}Y_x$ alloy is ranged from about 0.005 to about 0.25 in atomic percent.

Figure 2:
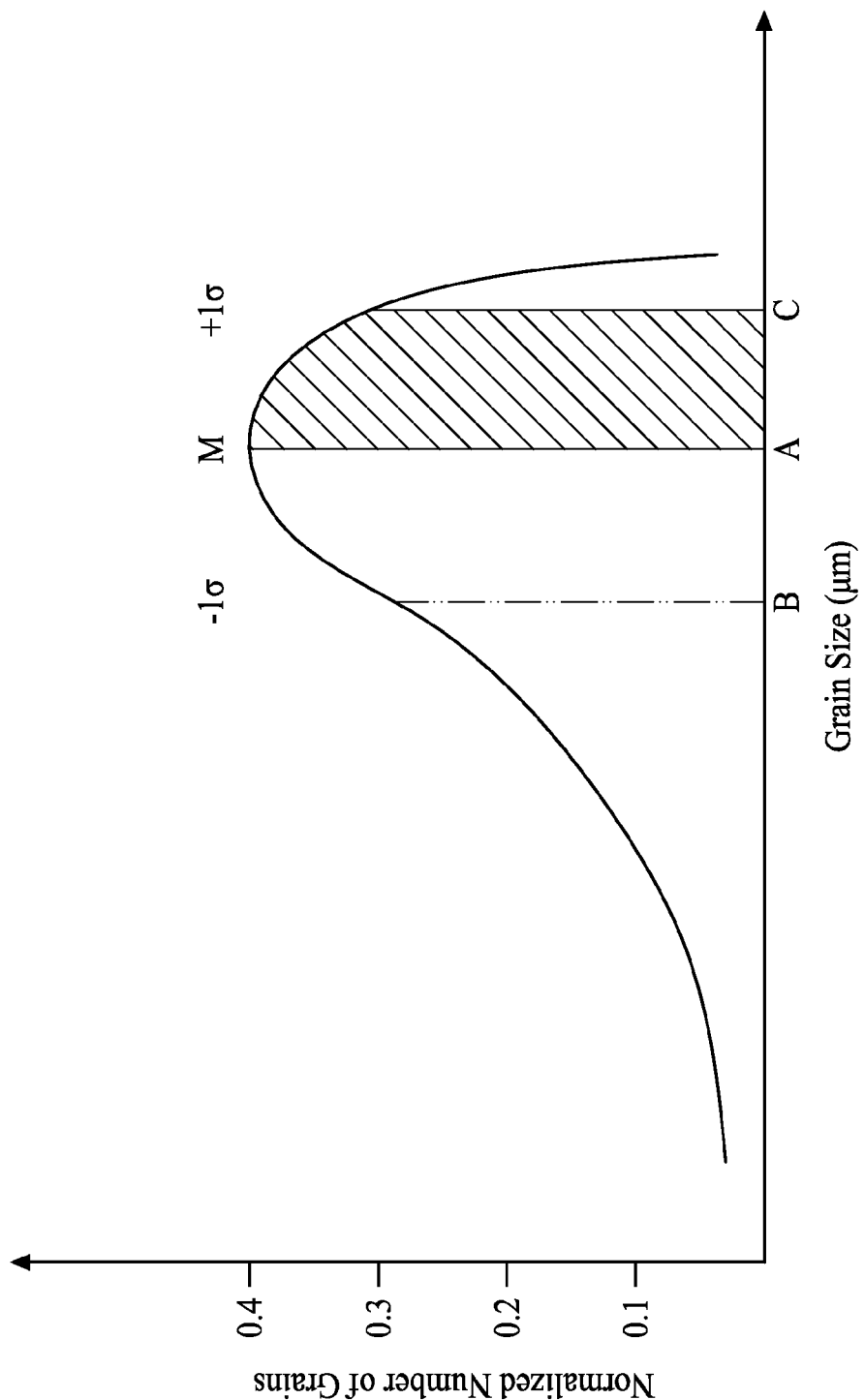
FIG. 2 is a grain size dispersion curve in accordance with some embodiments of the present disclosure.

As shown in FIG. 1, the grain size of the silver alloy bump body 101 forms a dispersion curve in FIG. 2. In some embodiments, the dispersion curve in FIG. 2 is obtained through image analysis software program such as, but not limited to, CLEMEX Vision PE. In FIG. 2, an X-axis of the dispersion curve indicates grain size, whereas a Y-axis of the dispersion curve shows normalized number of grains. Grain size calculation in the present disclosure is aided by a computer analysis program (for example, TSL OIM analysis). In some embodiments, the computer analysis program convert the area of a grain into a hypothetical circle having a same area, and a diameter of such hypothetical circle is defined as a grain size with a unit in length (usually in micrometer). However, the grain size calculation is not limited to the operation described above. In other embodiments, an average grain size is obtained by drawing a diagonal line on a TEM picture or an SEM picture of a cross sectional plane of the silver alloy bump structure described herein, and dividing a length of the diagonal line by the number of grains said diagonal line encounters. Any grain size measurement operation is suitable as long as it is aided by computer software or it is conducted under a consistent and systematic manner.

After plotting out the dispersion curve as shown in FIG. 2, a standard deviation can be measured as a morphology feature of the microstructure of the silver alloy bump body 101. In some embodiments, the dispersion curve has an eschewed bell shape which possesses a maximum closer to a right end of the dispersion curve. In some embodiments, a mean value or an expectation value of the grain size is represented by a maximum of the dispersion curve. As shown in FIG. 2, the mean value M corresponds to a grain size A, which, in some embodiments, is in a range of from about 0.7 µm to about 0.8 µm. One standard deviation away from the mean value M to a positive direction (+1 σ) corresponds to a grain size C, which, in some embodiments, is in a range of from about 1.0 nm to about 1.1 nm. One standard deviation away from the mean value M to a negative direction (−1 σ) corresponds to a grain size B, which, in some embodiments, is in a range of from about 0.4 nm to about 0.5 nm. In some embodiments, one standard deviation is defined as a grain size deviated from the mean value M, and wherein the number of the grain having a grain size between the deviated grain size B or C and the mean value M is accountable for 34% of the total number of grains. Note the dispersion curve obtained from actual grain size measurement does not have to be symmetric about the mean value M, and hence in some embodiments, a difference between one standard deviation away from the mean value M to a positive direction (+1 σ) at grain size C and the mean value M is not necessarily the same as a difference between one standard deviation away from the mean value M in a negative direction (−1 σ) at grain size B and the mean value M.

In some embodiments of the present disclosure, a difference between grain size C and grain size A is from about 0.2 µm to about 0.4 µm. In other embodiments, a difference between grain size B and grain size A is from about 0.2 to about 0.4 nm. By utilizing the electroplating operation discussed in the present disclosure, the grain size of the silver alloy bump body 101 demonstrates a uniform distribution and a difference between one standard deviation away from the mean value M (to the positive or to the negative direction) can be quantified as within a range of from about 0.2 μm to about 0.4 μm.

Figure 3:
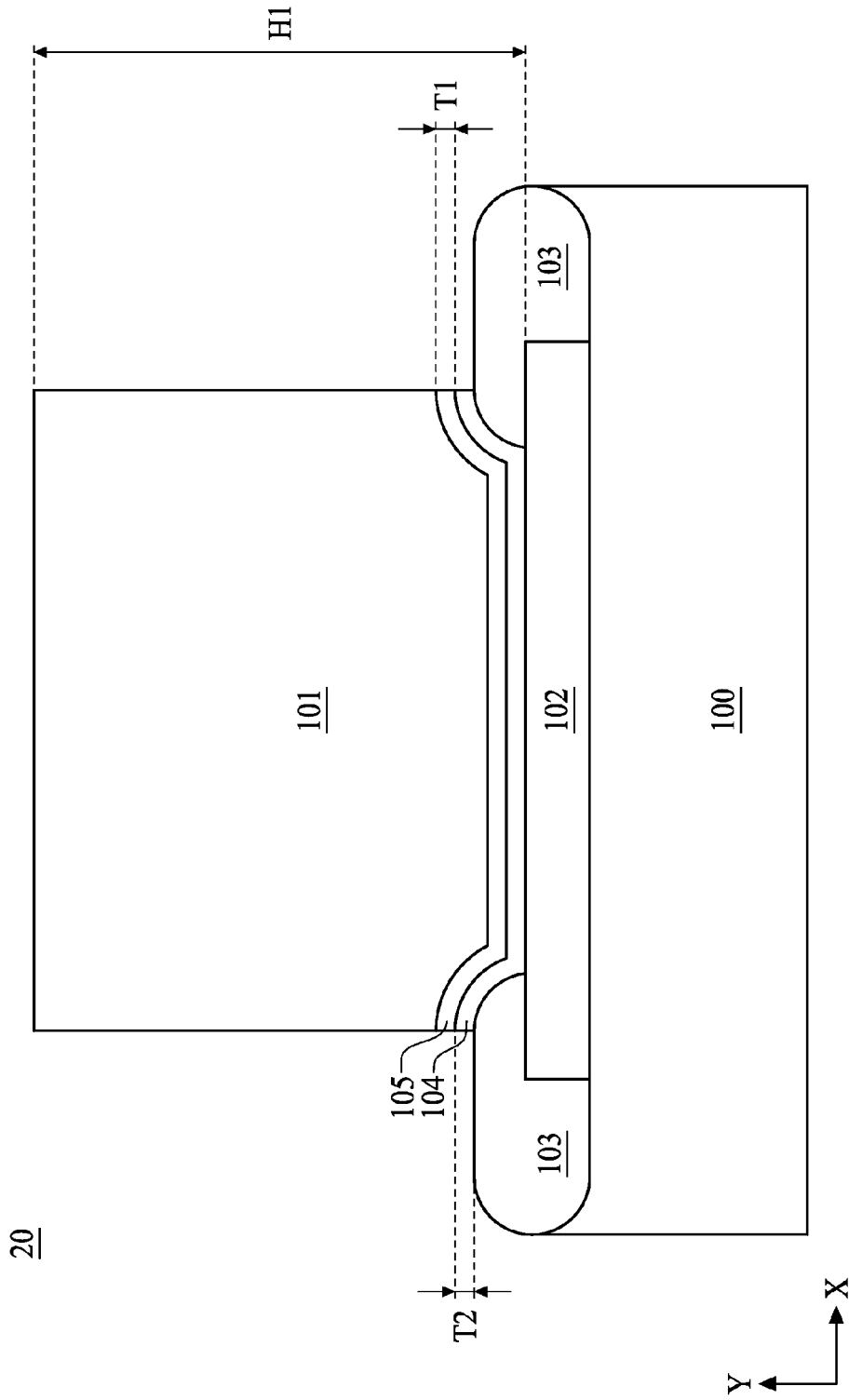
FIG. 3 is a cross sectional view of a silver alloy bump structure in accordance with some embodiments of the present disclosure.

Referring to FIG. 3, a cross section of a silver alloy bump structure 20 is shown. Compared to the silver alloy bump structure 10 in FIG. 1, the silver alloy bump structure 20 further includes an under bump metallization (UBM) layer 104 and a seed layer 105. In some embodiments, the seed layer 105 contains silver or silver alloy and is prepared by one of the chemical vapor deposition (CVD), sputtering, and electroplating operation. In some embodiments, the UBM layer 104 has a single-layer structure or a composite structure including several sub-layers formed of different materials, and includes a layer(s) selected from a nickel layer, a titanium layer, a titanium tungsten layer, a palladium layer, a gold layer, a silver layer, and combinations thereof.

As shown in FIG. 3, a height H1 of the silver alloy bump body 101 is measured from a top surface of the silver alloy bump body to a top surface of the conductive pad 102. In some embodiments, the height H1 of the silver alloy bump body 101 or the $Ag_{1-x}Y_x$ alloy is in a range of from about 9 μm to about 15 μm. In proportionate of the height H1 of the silver alloy bump body 101, a thickness T2 of the UBM layer 104 is commensurate to a thickness T1 of the seed layer 105. In some embodiments, a thickness T2 of the UBM layer 104 is in a range of from about 1000 Å to about 3000 Å, and a thickness T1 of the seed layer 105 is in a range of from about 1000 Å to about 3000 Å.

Figure 4:
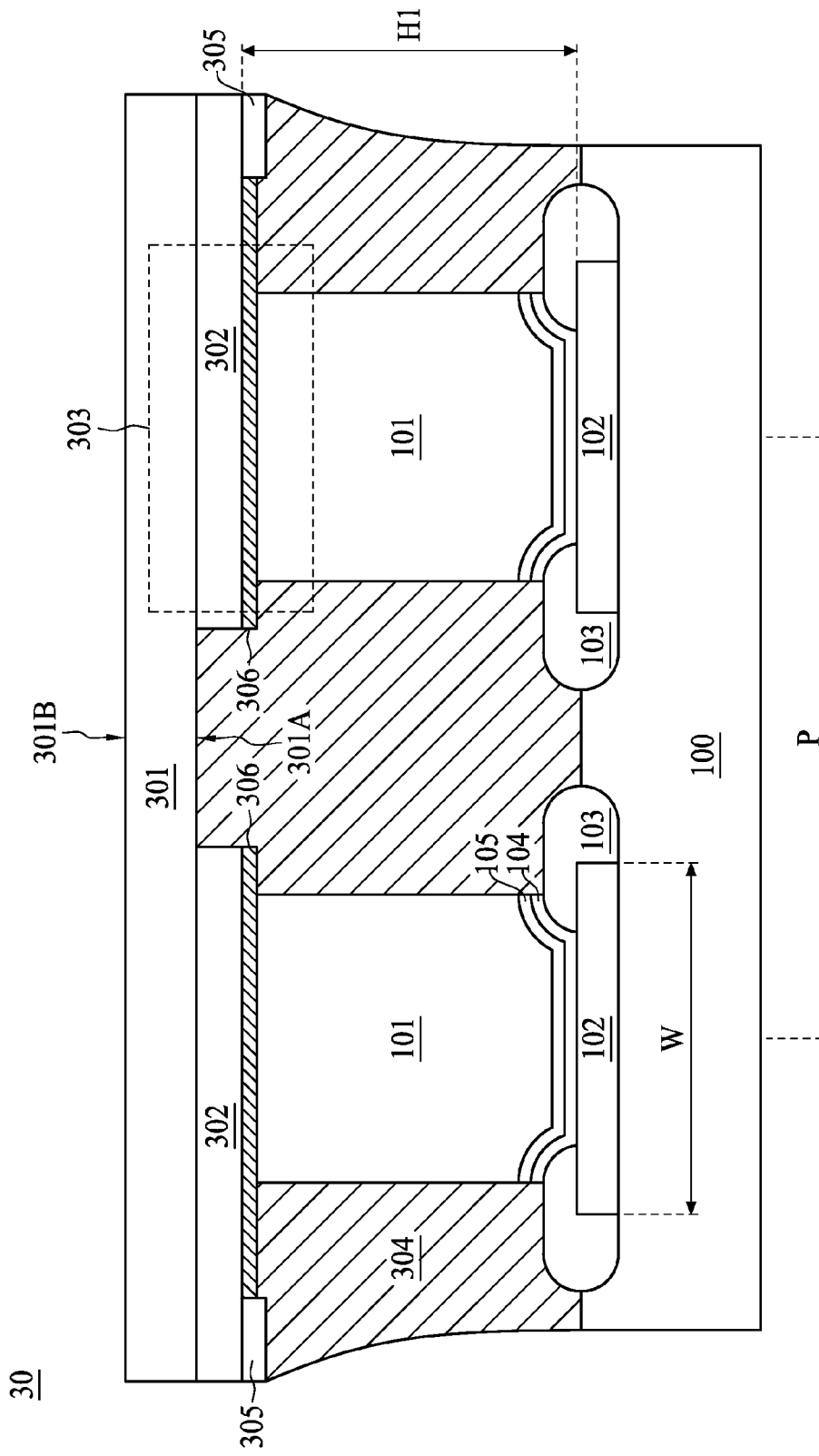
FIG. 4 is a cross sectional view of a chip-on-film (COF) semiconductor structure with a silver alloy bump structure in accordance with some embodiments of the present disclosure.

Referring to FIG. 4, a cross section of a chip-on-film (COF) semiconductor structure 30 is shown. The COF semiconductor structure 30 includes a flexible film 301 having a first surface 301A and a second surface 301B. The flexible film 301 includes, but not limited to, flexible printed circuit board (FPCB) or polyimide (PI). A conductive layer 302 such as a conductive copper trace is patterned on the first surface 301A of the flexible film 301. In FIG. 4, elements with identical numeral labels as those shown in FIG. 1 and FIG. 3 are referred to same elements or their equivalents and are not repeated here for simplicity. In FIG. 4, two silver alloy bump bodies 101 electrically couple the device 100 to the conductive layer 302 of the flexible film 301. In some embodiments, underfill material 304, for example, solventless epoxy resin, with appropriate viscosity is injected into the space between the flexible film 301 and the device 100.

Figure 5:
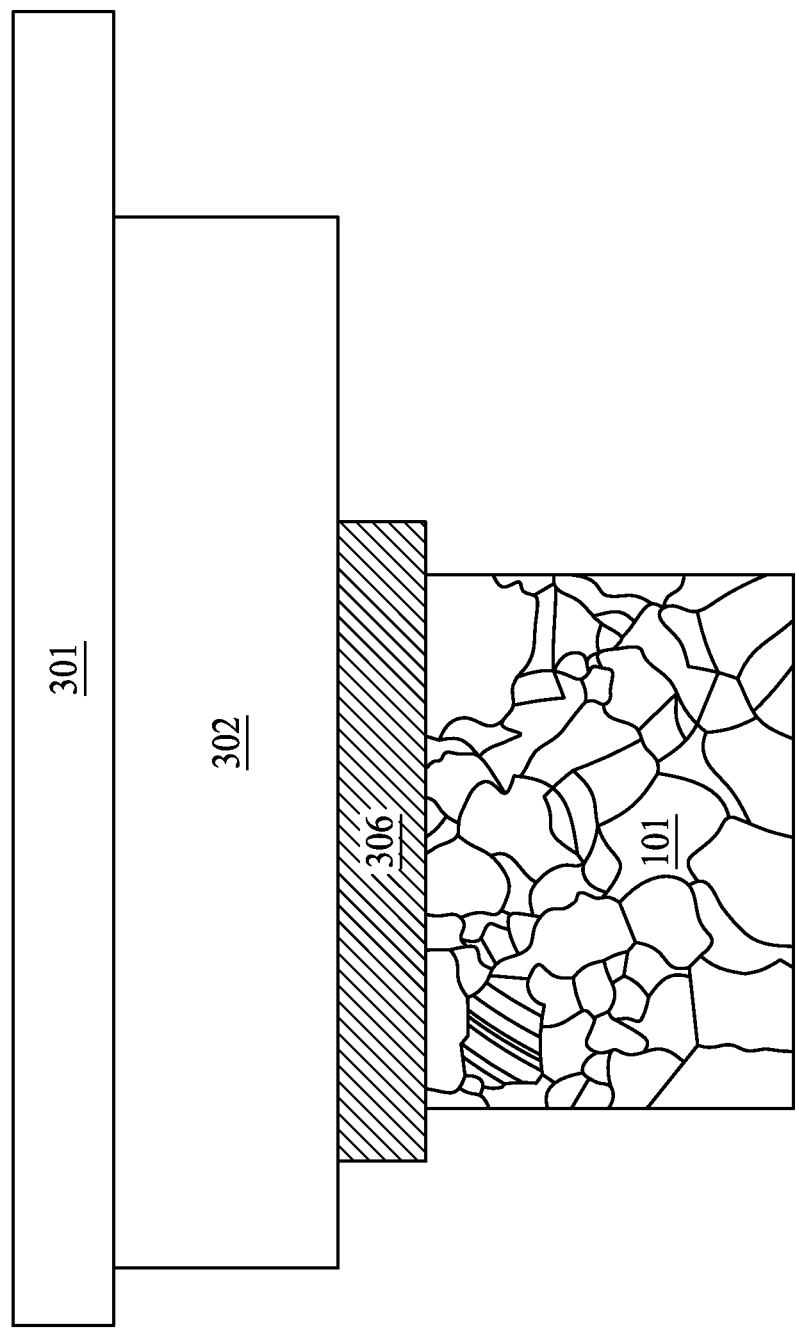
FIG. 5 is an enlarged view of a joint portion shown in FIG. 4 in accordance with some embodiments of the present disclosure.

The silver alloy bump body 101 shown in FIG. 4 includes $Ag_{1-x}Y_x$ alloy, wherein specie Y is gold, palladium, or the combination thereof. For example, $Ag_{1-x}Y_x$ alloy can be binary metal alloys such as $Ag_{1-x}Au_x$ or $Ag_{1-x}Pd_x$, furthermore, $Ag_{1-x}Y_x$ alloy can be ternary metal alloy such as $Ag_{1-x}(AuPd)_x$. In some embodiments, the content of the specie Y in the $Ag_{1-x}Y_x$ alloy is ranged from about 0.005 to about 0.25 in atomic percent. In some embodiments, specie Y in the $Ag_{1-x}Y_x$ alloy includes metal forming complete solid solution with silver at any weight percentage. As shown in FIG. 4, a height H1 of the silver alloy bump body 101 is in a range of from about 9 nm to about 15 nm, and a pitch P between the adjacent silver alloy bump bodies 101 is below 10 nm. In some embodiments, a width W of the conductive pad 102 is in a range of from about 10 nm to about 20 nm. In FIG. 4, a solder resist pattern 305 is positioned on the conductive layer 302. A solder layer 306 is applied to a joint of the silver alloy bump body 101 and the conductive layer 302. In some embodiments of the present disclosure, the solder layer 306 can be conventional SnPb or lead-free solder. The joint portion surrounded by dotted box 303 is enlarged and shown in FIG. 5. Referring to FIG. 5, the solder layer 306 includes not only solder material itself but also $Ag_{1-a}Sn_a$ alloy. In some embodiments, the $Ag_{1-a}Sn_a$ alloy at least includes $Ag_{0.5}Sn_{0.5}$ alloy. In certain embodiments, when an inner lead bonding (ILB) temperature for a COF set at the silver alloy bump side is about 400 degrees Celsius, the liquid phase of the AgSn alloy system is substantially more than the liquid phase of the AuSn alloy system given the same bonding temperature set at a free end of the alloy bump. Excess liquid phase of the AgSn alloy promotes an adhesion between the silver alloy bump body 101 and the conductive layer 302, and hence better junction reliability is obtained in AgSn alloy system by using a Ag-based alloy bump. On the other hand, a lower ILB temperature for the COF can be used in the AgSn alloy system. A lower ILB temperature, for example, lower than 400 degrees Celsius, can prevent the flexible film 301 from deformation or shrinkage. In other embodiments, an anisotropic conductive film (ACF) can be used to connect the silver alloy bump body 101 and the conductive layer 302.

Referring to FIG. 5, only the microstructure of the silver alloy bump body 101 is shown. An average grain size of the silver alloy bump body 101 is in a range of from about 0.5 nm to about 1.5 nm. Because the melting temperature of silver is around 962 degrees Celsius, an annealing temperature applied to the silver alloy bump body 101 can be lower than 250 degrees Celsius to avoid the cracking of the passivation layer 103 shown in FIG. 1, FIG. 3, and FIG. 4. Compared to a higher melting temperature of gold (1064 degrees Celsius), a lower melting temperature results to a lower annealing temperature, and hence the previously-grown structure such as the passivation layer is subjected to less thermal stress. In some embodiments, after annealing the silver alloy bump body 101 under a temperature lower than 250 degrees Celsius, the average grain size of the $Ag_{1-x}Y_x$ alloy measured by the method described herein is around 1 μm.

Figure 6:
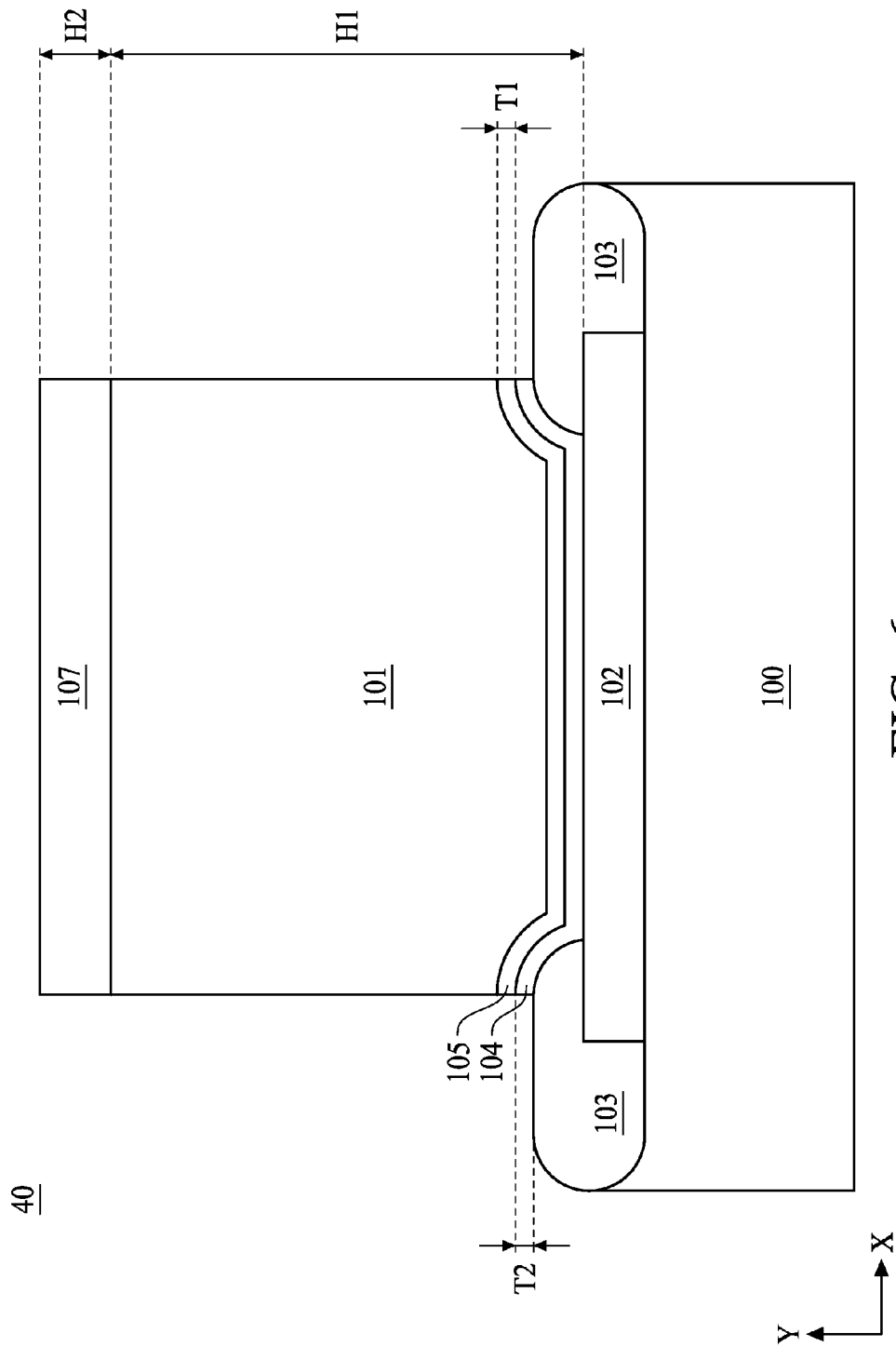
FIG. 6 is a cross sectional view of a multilayer bump structure in accordance with some embodiments of the present disclosure.

Referring to FIG. 6, a cross section of a multilayer bump structure 40 is shown. Compared to the silver alloy bump structure 20 in FIG. 3, the multilayer bump structure 40 further includes a metal layer 107 on a top surface of the silver alloy bump body 101. In some embodiments, the multilayer bump structure 40 includes a silver alloy bump structure as those shown in FIG. 1, FIG. 3, and FIG. 4, with a silver alloy bump body 101 having a bottom surface connected to a conductive pad 102 and a top surface connected to a metal layer 107. In some embodiments, the metal layer 107 is positioned not only on the top surface but also at a sidewall of the silver alloy bump body 101. In some embodiments, the metal layer 107 is metallic materials other than silver. In other embodiments, the metal layer 107 of the multilayer bump structure 40 includes gold, gold alloy, copper, or copper alloy. In other embodiments, the metal layer 107 of the multilayer bump structure 40 includes Cu and the alloys thereof. A height H2 of the metal layer 107 shall be thick enough to form a joint interface between the silver alloy bump body 101 and an external device or substrate, for example, a conductive trace of a flexible film (not shown here).

In some embodiments, a thickness H2 of the metal layer 107 is from about 1 μm to about 3 μm, and the metal layer 107 is formed by an electroplating operation. In FIG. 6, the multilayer bump structure 40 includes an under bump metallization (UBM) layer 104 and a seed layer 105. In some embodiments, the seed layer 105 contains silver or silver alloy and is prepared by one of the chemical vapor deposition (CVD), sputtering, and electroplating operation. In some embodiments, the UBM layer 104 has a single-layer structure or a composite structure including several sub-layers formed of different materials, and includes a layer(s) selected from a nickel layer, a titanium layer, a titanium tungsten layer, a palladium layer, a gold layer, a silver layer, and combinations thereof.

The silver alloy bump body 101 shown in FIG. 6 includes $Ag_{1-x}Y_x$ alloy, wherein specie Y is gold, palladium, or the combination thereof. For example, $Ag_{1-x}Y_x$ alloy can be binary metal alloys such as $Ag_{1-x}Au_x$ or $Ag_{1-x}Pd_x$, furthermore, $Ag_{1-x}Y_x$ alloy can be ternary metal alloy such as $Ag_{1-x}(AuPd)_x$. In some embodiments, the content of the specie Y in the $Ag_{1-x}Y_x$ alloy is ranged from about 0.005 to about 0.25 in atomic percent. In some embodiments, specie Y in the $Ag_{1-x}Y_x$ alloy includes metal forming complete solid solution with silver at any weight percentage. As shown in FIG. 6, a height H1 of the silver alloy bump body 101 is in a range of from about 9 nm to bout 15 nm.

Figure 7:
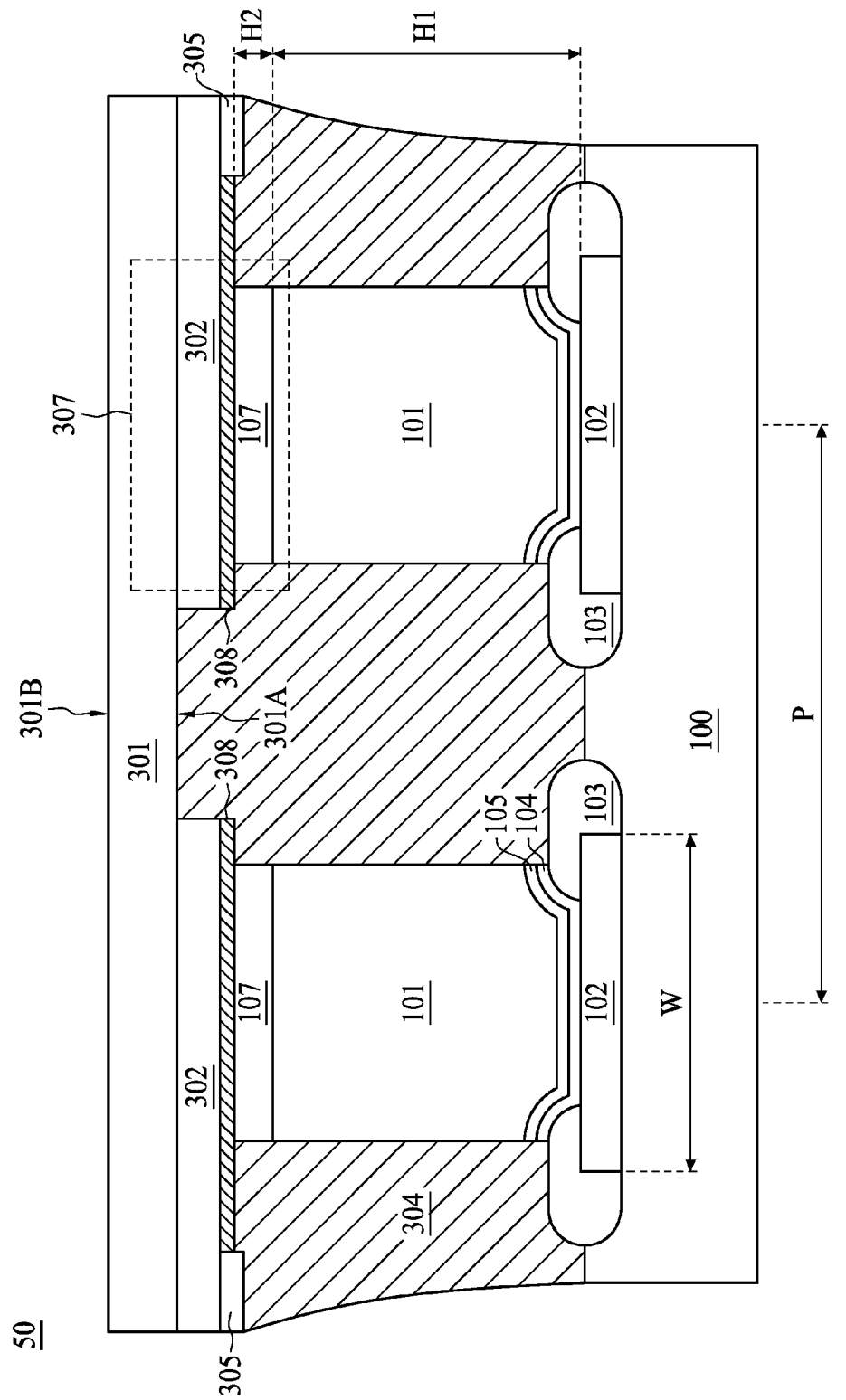
FIG. 7 is a cross sectional view of a chip-on-film (COF) semiconductor structure with a multilayer bump structure in accordance with some embodiments of the present disclosure.

Referring to FIG. 7, a cross section of a chip-on-film (COF) semiconductor structure 50 is shown. The COF 50 includes a flexible film 301 having a first surface 301A and a second surface 301B. The flexible film 301 includes, but not limited to, flexible printed circuit board (FPCB) or polyimide (PI). A conductive layer 302 such as a conductive copper trace is patterned on the first surface 301A of the flexible film 301, and a solder resist pattern 305 is positioned on the conductive layer 302. In FIG. 7, elements with identical numeral labels as those shown in FIG. 1 and FIG. 3 are referred to same elements or their equivalents and are not repeated here for simplicity. In FIG. 7, two multilayer bump structure (101, 107), including silver alloy bump bodies 101 and a metal layer 107, electrically couple the device 100 to the conductive layer 302 of the flexible film 301. In some embodiments, underfill material 304, for example, solventless epoxy resin, with appropriate viscosity is injected into the space between the flexible film 301 and the device 100. In the case that the metal layer 107 is made of electroplated gold film, the subsequent bonding operations can utilize the bonding operation conventional in the art for a gold bump.

The silver alloy bump body 101 shown in FIG. 7 includes $Ag_{1-x}Y_x$ alloy, wherein specie Y is gold, palladium, or the combination thereof. For example, $Ag_{1-x}Y_x$ alloy can be binary metal alloys such as $Ag_{1-x}Au_x$ or $Ag_{1-x}Pd_x$, furthermore, $Ag_{1-x}Y_x$ alloy can be ternary metal alloy such as $Ag_{1-x}(AuPd)_x$. In some embodiments, the content of the specie Y in the $Ag_{1-x}Y_x$ alloy is ranged from about 0.005 to about 0.25 in atomic percent. In some embodiments, specie Y in the $Ag_{1-x}Y_x$ alloy includes metal forming complete solid solution with silver at any weight percentage. The metal layer 107 shown in FIG. 7 includes metallic materials other than silver, for example, gold or copper. As shown in FIG. 7, a height H1 of the silver alloy bump body 101 is in a range of from about 9 μm to bout 15 μm, and a pitch P between the adjacent silver alloy bump bodies 101 is below 10 μm. A height H2 of the metal layer 107 is in a range of from about 1 μm to about 3 μm. In some embodiments, a width W of the conductive pad 102 is in a range of from about 20 μm to about 30 μm.

In FIG. 7, a solder resist pattern 305 is positioned on the conductive layer 302. A solder layer 308 is applied to a joint of the multilayer bump structure (101, 107) and the conductive layer 302. In some embodiments of the present disclosure, the solder layer 308 can be conventional SnPb or lead-free solder. The joint portion surrounded by dotted box 307 is enlarged and shown in FIG. 9.

Figure 8:
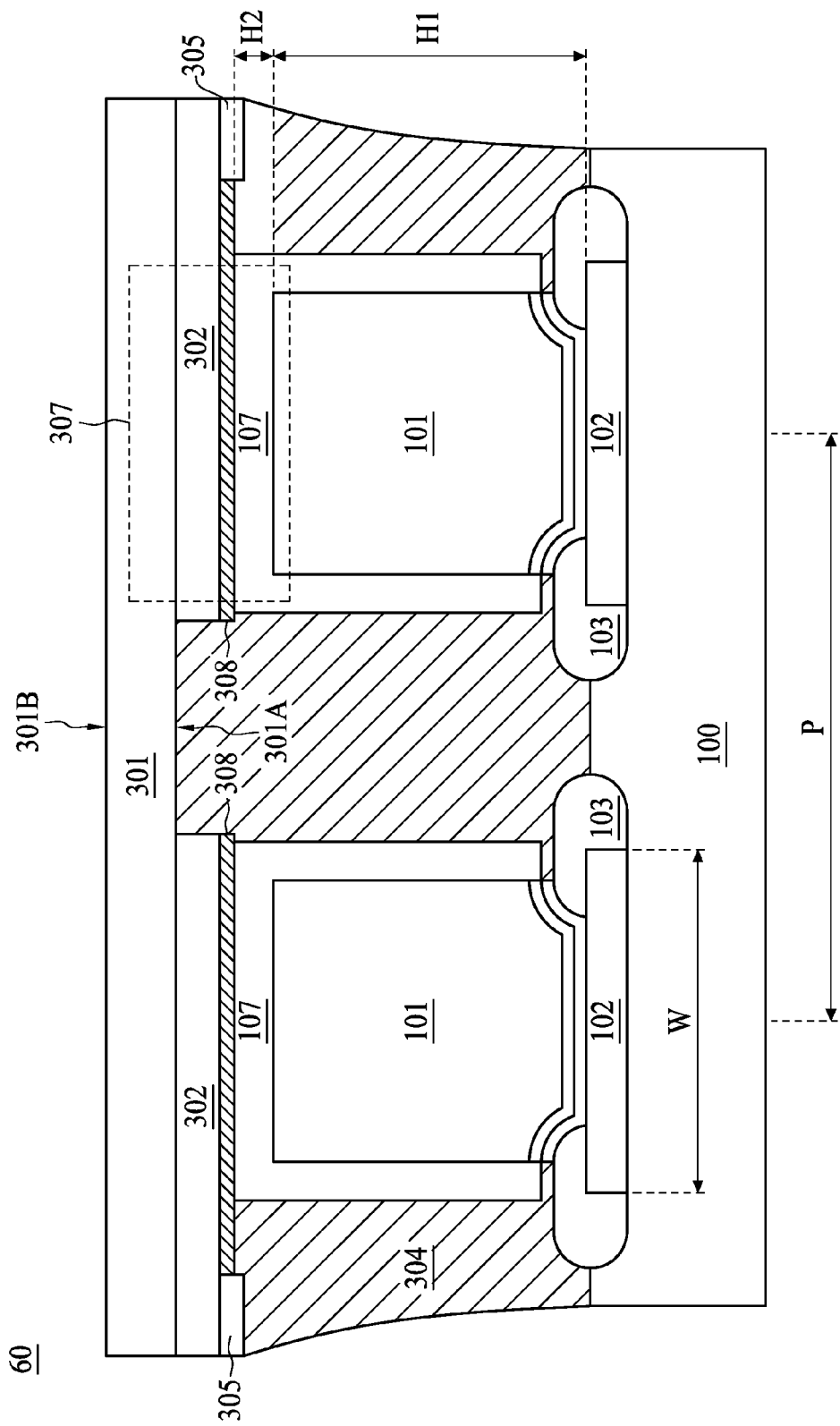
FIG. 8 is a cross sectional view of a chip-on-film (COF) semiconductor structure with a multilayer bump structure in accordance with some embodiments of the present disclosure.

The cross section of a chip-on-film (COF) semiconductor structure 60 shown in FIG. 8 is similar to the cross section of a COF semiconductor structure 50 shown in FIG. 7 except for the metal layer 107 in the FIG. 8 covers a top surface and a sidewall of the silver alloy bump body 101. In other words, the multilayer bump structure (101, 107) can have at least two different constructions. In FIG. 7, the metal layer 107 is formed over the top surface of the silver alloy bump body 101 by an electroplating operation or an electroless plating operation, whereas in FIG. 8, the metal layer 107 is formed over the top surface and at a sidewall of the silver alloy bump body 101 by an electroplating operation or an electroless plating operation. Elements in FIG. 8 having identical numeral labels as those shown in FIG. 7 are referred to same elements or their equivalents and are not repeated here for simplicity.

In some embodiments of the present disclosure, in addition to bond the silver alloy bump body 101 or the multilayer bump structure (101, 107) to the flexible film 301 by solder joint, an anisotropic conductive film (ACF) can be adopted to form a connection in the COF semiconductor structures 30, 50, and 60 as shown in FIGS. 4, 7, and 8.

Figure 9:
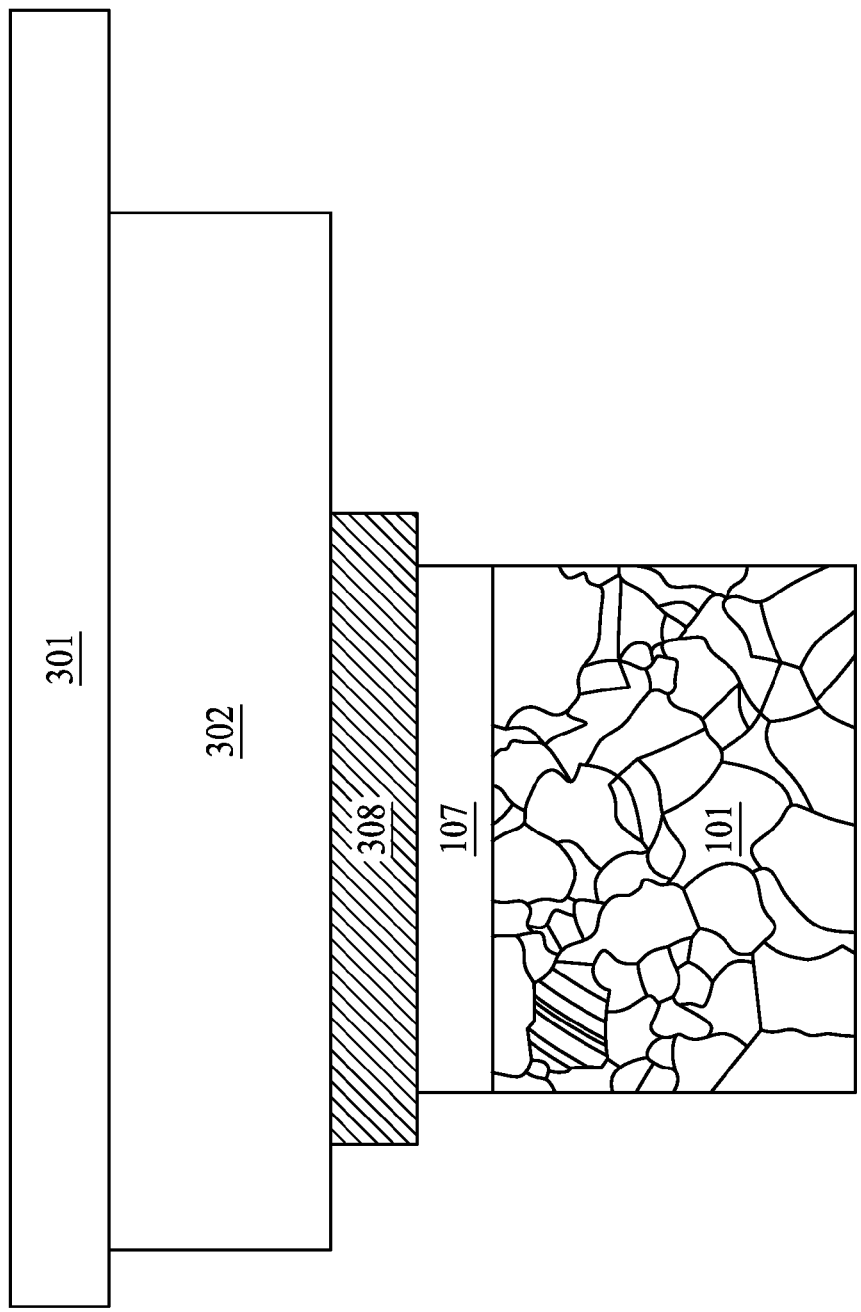
FIG. 9 is an enlarged view of a joint portion shown in FIG. 7 in accordance with some embodiments of the present disclosure.

Referring to FIG. 9, the solder layer 308 includes not only solder material itself but also $Au_{1-a}Sn_a$ alloy if the metal layer 107 is made of Au or its alloys. In some embodiments, the $Au_{1-a}Sn_a$ alloy at least includes $Au_{0.5}Sn_{0.5}$ alloy. In other embodiments, an anisotropic conductive film (ACF) can be used to connect the multilayer bump structure (101, 107) and the conductive layer 302.

Figure 10:
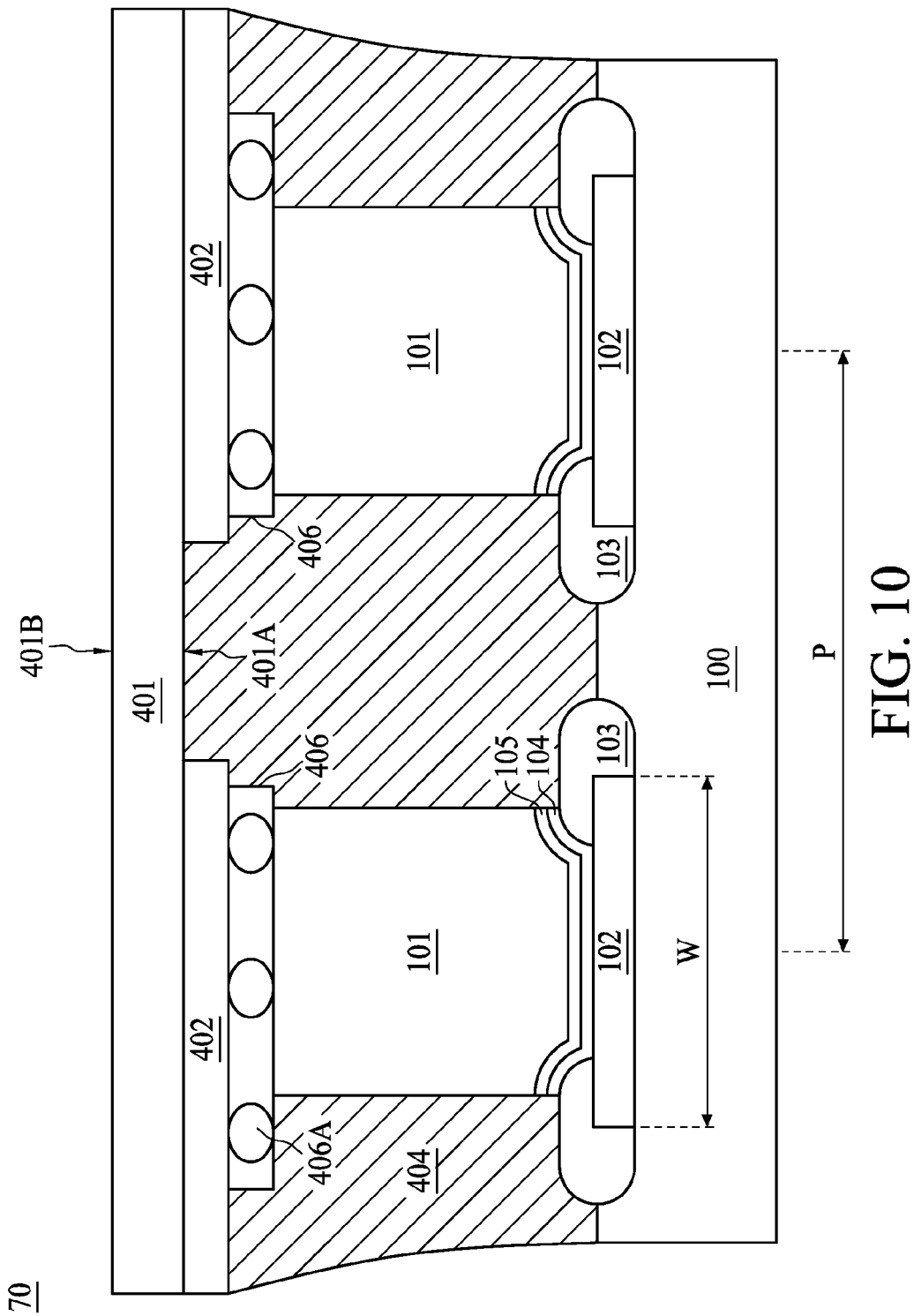
FIG. 10 is a cross sectional view of a chip-on-glass (COG) semiconductor structure with a silver alloy bump structure in accordance with some embodiments of the present disclosure.

In some embodiments of the present disclosure, as shown in FIG. 10, the silver alloy bump body 101 discussed herein can also be used in a chip-on-glass (COG) semiconductor structure 70. The electrical connection between the conductive trace 402 on a first surface 401A of a transparent substrate and silver alloy bump body 101 of a device 100 to be packaged can be an anisotropic conductive film (ACF) 406. For example, the transparent substrate is a glass substrate 401. An ACF includes Au-coated plastic sphere 406A with a diameter of from about 3 nm to about 5 μm, dispersed in a thermal setting epoxy matrix. In some embodiments, the boding temperature for using ACF in a COG semiconductor structure 60 is about 200 degrees Celsius.

Figure 11:
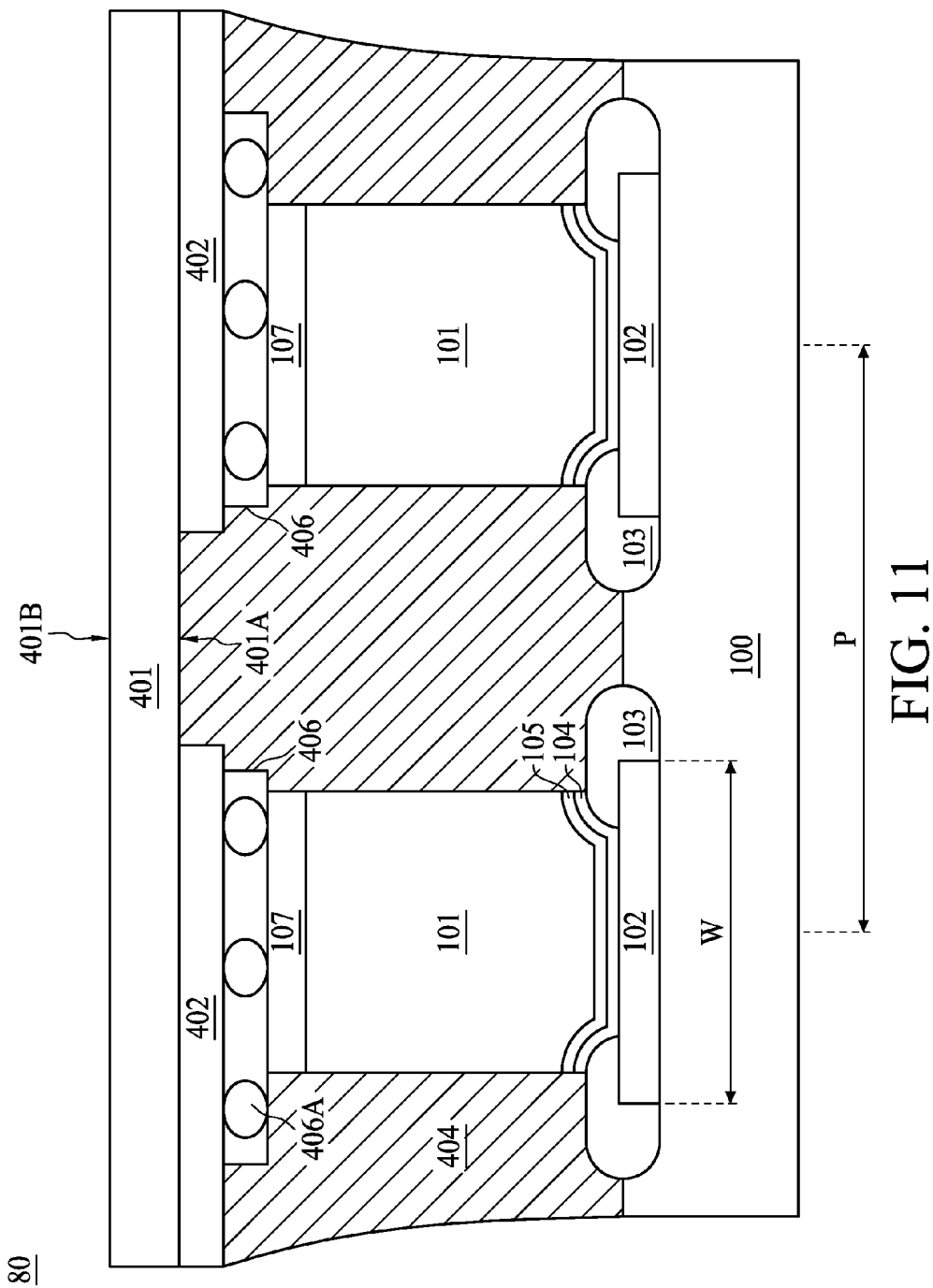
FIG. 11 is a cross sectional view of a chip-on-glass (COG) semiconductor structure with a multilayer bump structure in accordance with some embodiments of the present disclosure.

In some embodiments of the present disclosure, as shown in FIG. 11, the multilayer bump structure (101, 107) discussed herein can also be used in a chip-on-glass (COG) semiconductor structure 80. The electrical connection between the conductive trace 402 on a first surface 401A of a glass substrate 401 and multilayer bump structure (101, 107) of a device 100 to be packaged can be an anisotropic conductive film (ACF) 406. In some embodiments, the conductive trace 402 on the first surface 401A of the glass substrate 401 is made of transparent and conductive materials such as indium tin oxide (ITO). For example, the ACF includes Au-coated plastic sphere 406A with a diameter of from about 3 nm to about 5 μm, dispersed in a thermal setting epoxy matrix. In some embodiments, the boding temperature for using ACF in a COG semiconductor structure 70 is about 200 degrees Celsius. In some embodiments, the metal layer 107 of the multilayer bump structure (101, 107) is an electroplated gold film with a thickness of from about 1 μm to about 3 μm. Under this circumstance, the bonding operation conventional to the gold bump art can be utilized in connecting the multilayer bump structure (101, 107) and an external device such as a glass substrate.

Figure 12:
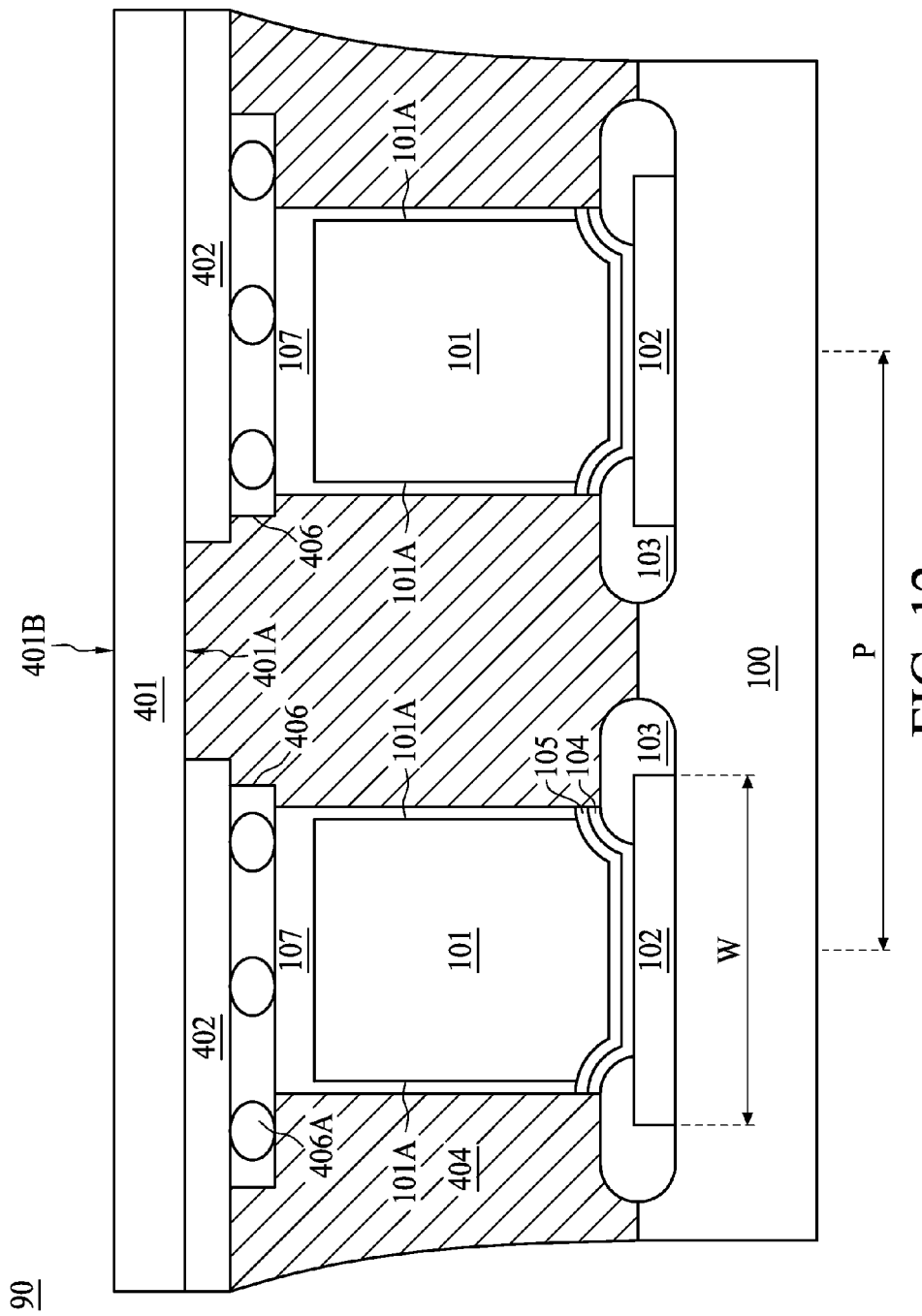
FIG. 12 is a cross sectional view of a chip-on-glass (COG) semiconductor structure with a multilayer bump structure in accordance with some embodiments of the present disclosure.

In some embodiments of the present disclosure, as shown in FIG. 12, the multilayer bump structure (101, 107) discussed herein can also be used in a chip-on-glass (COG) semiconductor structure 90. The electrical connection between the conductive trace 402 on a first surface 401A of a glass substrate 401 and multilayer bump structure (101, 107) of a device 100 to be packaged can be an anisotropic conductive film (ACF) 406. For example, the ACF includes Au-coated plastic sphere 406A with a diameter of from about 3 μm to about 5 μm, dispersed in a thermal setting epoxy matrix.

In some embodiments, the boding temperature for using ACF in a COG semiconductor structure 90 is about 200 degrees Celsius. In some embodiments, the metal layer 107 of the multilayer bump structure (101, 107) is an electroplated gold film with a thickness of from about 1 μm to about 3 μm, covering a top surface 101B and a sidewall 101A of the silver alloy bump body 101. Under this circumstance, the bonding operation conventional to the gold bump art can be utilized in connecting the multilayer bump structure (101, 107) and an external device such as a glass substrate. In some embodiments, a thickness of the metal layer 107 on the top surface 101B is different from a thickness of the metal layer 107 covering the sidewall 101A of the silver alloy bump body 101.

The hardness of the silver alloy bump discussed herein can be easily adjusted by selecting appropriate electroplating baths. For example, the hardness of the silver alloy bump for COG application can be adjusted to about 100 HV. For another example, the hardness of the silver alloy bump for COF application can be adjusted to about 55 HV. Because the hardness of pure silver (about 85 HV) is situated between 55 HV and 100 HV, a silver alloy with desired hardness can be tailored by electroplating the silver alloy bump using different electroplating baths. In some embodiments, the COG application requires a silver alloy bump having a greater hardness to facilitate the ACF bonding operation. In other embodiments, the COF application requires a silver alloy bump having a lower hardness to prevent damaging the conductive traces on the flexible film.

Figure 13:
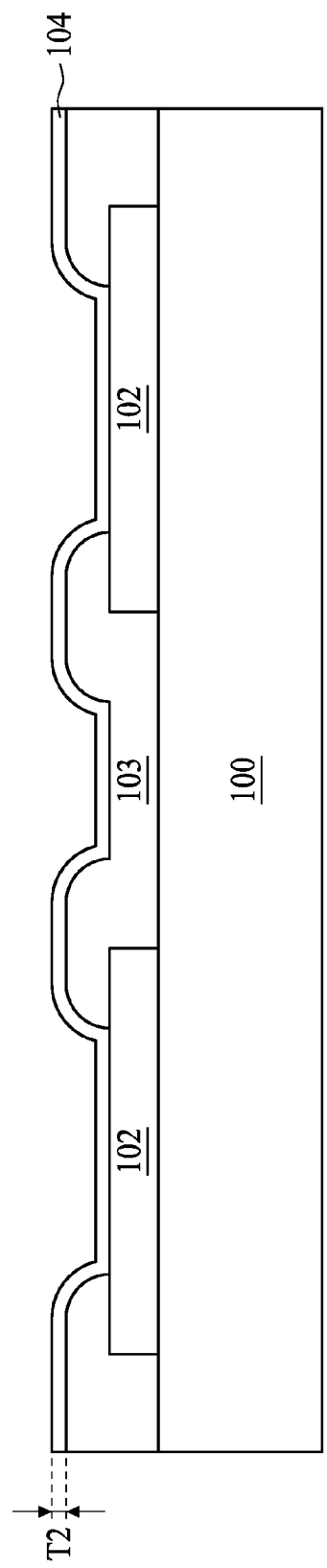
FIG. 13 to FIG. 26 show the operations of manufacturing a silver alloy bump structure and a multilayer bump structure in accordance with some embodiments of the present disclosure.
Figure 14:
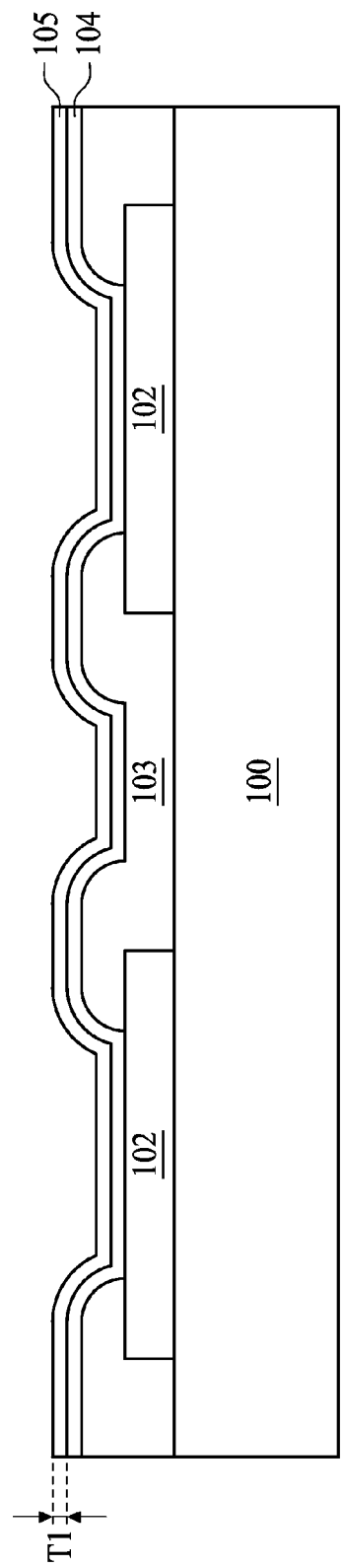

FIG. 13 to FIG. 26 show the manufacturing operation of the silver alloy bump described in the present disclosure. In FIG. 13, a UBM layer 104 is formed on the passivation layer 103 and a portion of the conductive pad 102. In some embodiments, the UBM layer 104 is formed by CVD, sputtering, electroplating, or electroless plating of the materials selected from nickel, titanium, titanium tungsten, palladium, gold, silver, and the combination thereof. In some embodiments, a thickness T2 of the UBM layer 104 is controlled to be in a range of from about 1000 Å to about 3000 Å. In FIG. 14, a seed layer 105 is deposited on the UBM layer 104. In some embodiments, the seed layer 105 is formed by CVD, sputtering, electroplating, or electroless plating of the materials containing silver. In some embodiments, a thickness T1 of the seed layer 105 is controlled to be commensurate with the thickness T2 of the UBM layer 104. For example, the thickness T1 is in a range of from about 1000 Å to about 3000 Å.

Figure 15:
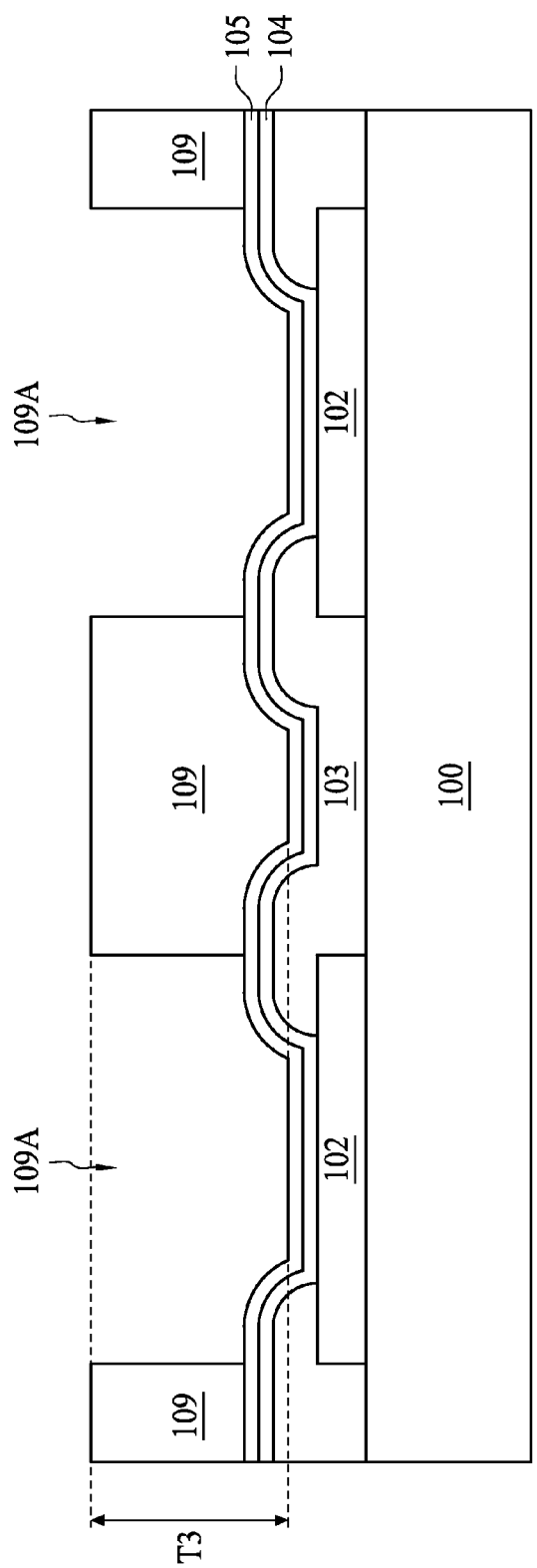

Referring to FIG. 15, a first mask layer 109, which can be a hard mask or a photoresist, is formed over the seed layer 105. An opening 109A of the first mask layer 109 is formed over the conductive pad 102 for receiving conductive bump materials. In some embodiments, the first mask layer 109 is made of positive photoresist having a thickness T3 greater than a thickness of the conductive bump to be plated. In other embodiments, the first mask layer 109 is made of negative photoreisist.

Figure 16:
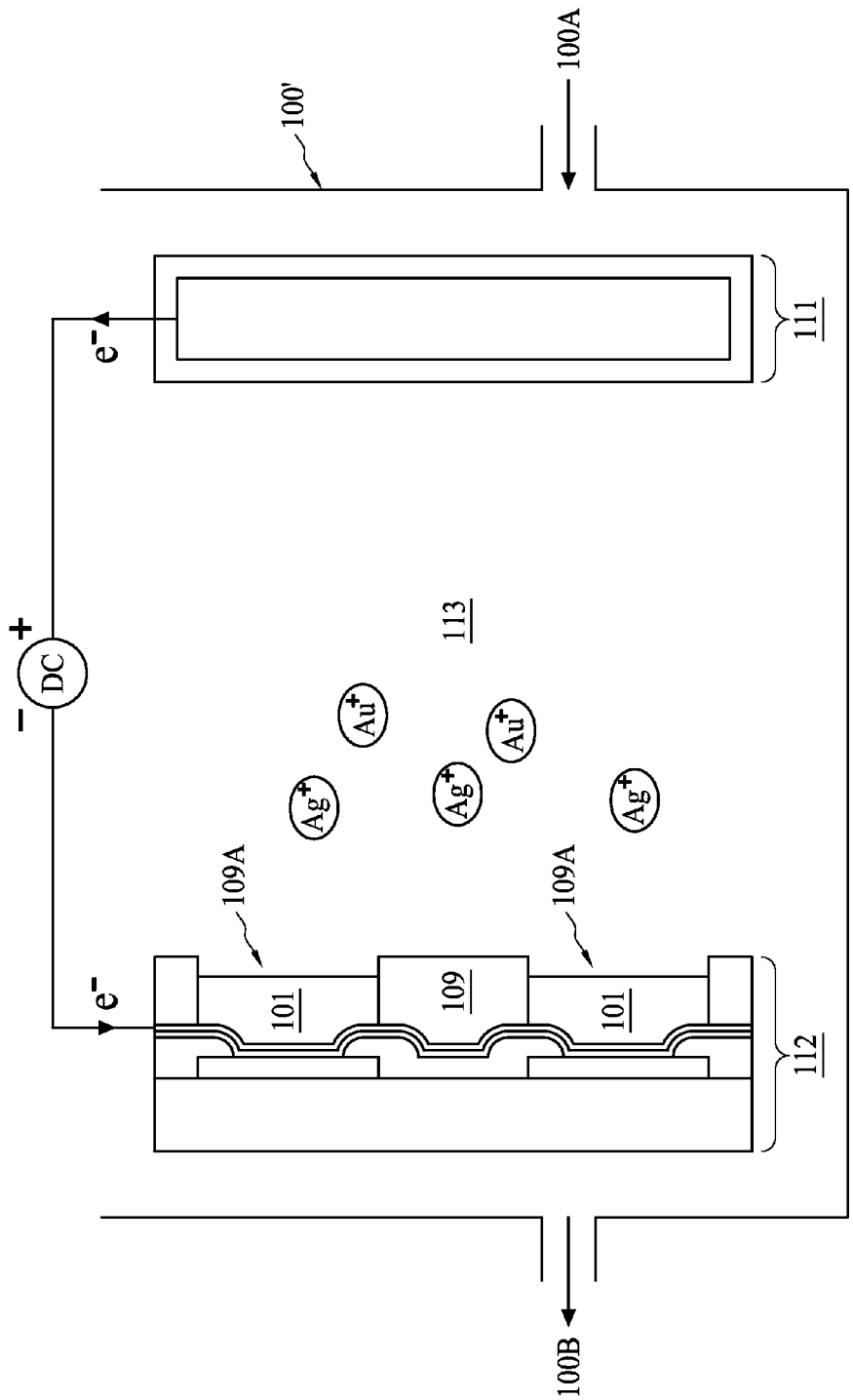
Figure 17:
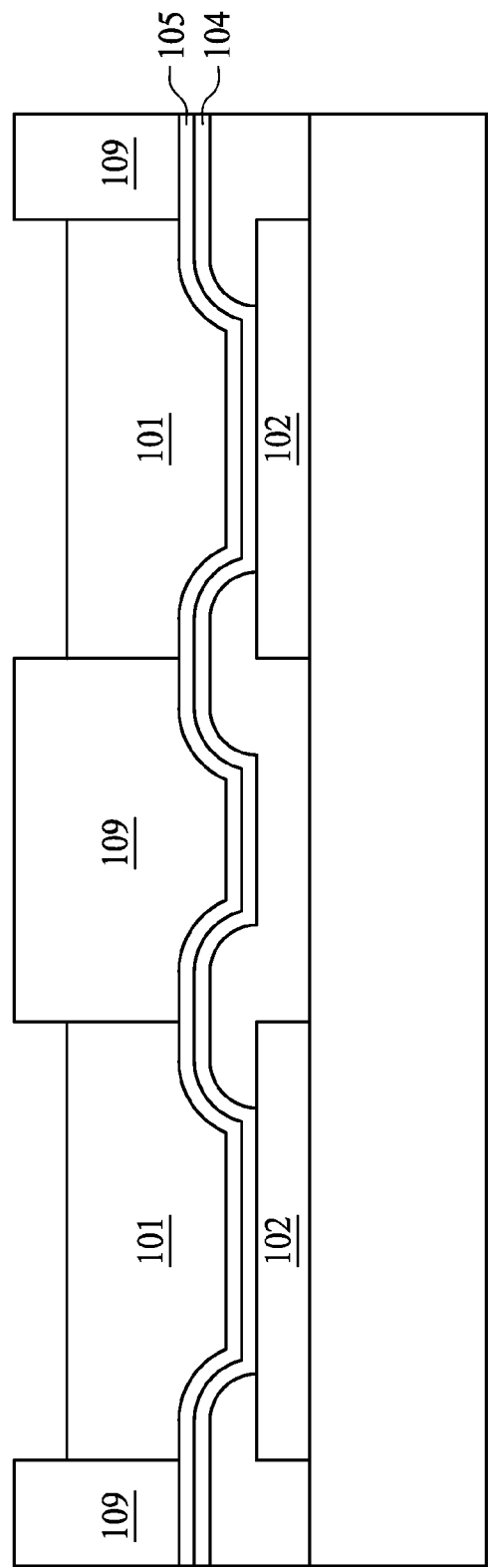

FIG. 16 and FIG. 17 show the electroplating operation and the result thereafter. FIG. 16 shows an electroplating system which includes a container 100' accommodating electroplating bath 113, an anode 111, and a cathode 112. In some embodiments, the anode 111 is insoluble and can be made of platinum-coated titanium, the wafer pad deposited with a proper seed layer is positioned at the cathode 112, and the electroplating bath 113 contains cyanide-base plating solution including at least one of $KAg(CN)_2$, $KAu(CN)_2$, $K_2Pd(CN)_4$, and their salts. In some embodiments, the pH value of the electroplating bath 113 is controlled around neutral, for example, from about 6 to about 8. A temperature of the electroplating bath 113 is controlled to be around 40 to 50 degrees Celsius. In some embodiments, the temperature of the electroplating bath 113 can be maintained by a thermal plate (not shown) positioned under the container 100'. In other embodiments, the temperature of the electroplating bath 113 can be maintained by an electroplating solution circulation system in which an outlet 100B discharges the electroplating solution and an inlet 100A intakes the temperature-controlled electroplating solution. Appropriate leveling agents including oxalate can be added to the electroplating bath 113 with a concentration of from about 2 ml/L to about 5 ml/L. In some embodiments, a current density of a direct current (DC) applied for silver alloy conductive bump plating is in a range of from about 0.1 ASD to about 0.5 ASD.

Referring to FIG. 16, the cathode 112 includes a wafer pad deposited with a seed layer 105 containing silver or silver alloy, and the reaction which occurs at the cathodes can be one of the following:

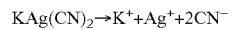
$$KAg(CN)_2 \rightarrow K^+ + Ag^+ + 2CN^-$$

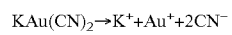
$$KAu(CN)_2 \rightarrow K^+ + Au^+ + 2CN^-$$

$$K_2Pd(CN)_4 \rightarrow 2K^+ + Pd^{2+} + 4CN^-$$

the anode 111 shown in FIG. 16 includes a platinum electrode and the reaction which occurs thereon can be:

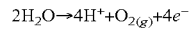
$$2H_2O \rightarrow 4H^+ + O_{2(g)} + 4e^-$$

A positive end of the external DC current is connected to the anode and a negative end of the external DC current is connected to the cathode. As can be seen in FIG. 16, the reduced silver ions and reduced palladium ions are deposited onto the seed layer 105 of the wafer pad, filling the openings 109A defined by the first mask layer 109 and forming AgAu binary alloy. In some embodiments, if the electroplating bath includes silver ion source (for example, $KAg(CN)_2$) and palladium ion source (for example, $K_2Pd(CN)_4$), through the same electroplating operation setting described above, the reduced silver ions and reduced gold ions are deposited onto the seed layer 105 of the wafer pad, filling the openings 109A defined by the first mask layer 109 and forming AgPd binary alloy. In some embodiments, if the electroplating bath includes silver ion source (for example, $KAg(CN)_2$ and its salts), gold ion source (for example, $KAu(CN)_2$ and its salts), and palladium ion source (for example, $K_2Pd(CN)_4$ and its salts), through the same electroplating operation setting described above, the reduced silver ions, reduced gold ions, and the reduced palladium ions are deposited onto the seed layer 105 of the wafer pad, filling the openings 109A defined by the first mask layer 109 and forming AgAuPd ternary alloy.

In some embodiments of electroplating a multilayer bump structure 40 as shown in FIG. 6, after the AgAu, AgPd, or AgAuPd alloys being deposited onto the seed layer of the wafer pad in FIG. 16, the wafer pad is then removed from the electroplating bath including several metal ion sources and being placed to another electroplating bath containing one specie of metal ion source for the deposition of the non-silver metal layer 107 as shown in FIG. 6.

Figure 18:
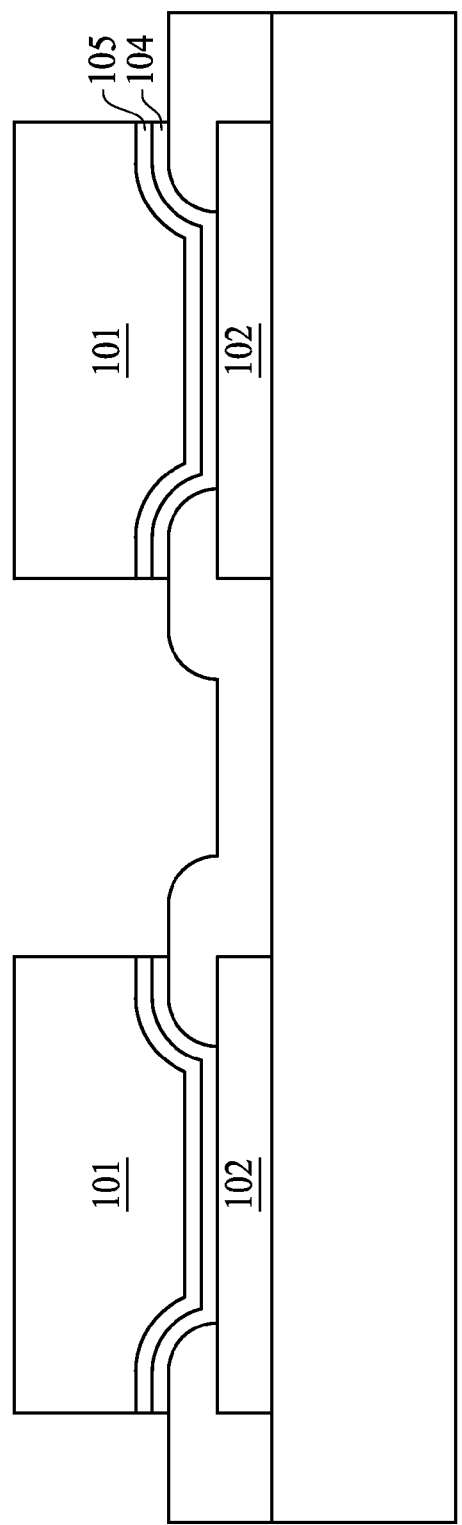

FIG. 17 shows a wafer pad after completion of the electroplating operation shown in FIG. 16. In FIG. 17, the silver alloy bump bodies 101 are formed over the conductive pads 102. In FIG. 18, the first mask layer 109 is stripped if a photoresist is used. The UBM layer 104 and the seed layer 105 not covered by the silver alloy bump body 101 are removed by an etching operation to isolate two silver alloy conductive bumps.

| Embodiment No. | First Cyanide-Based Bath | pH | J (ASD) | Temperature (° C.) |
| --- | --- | --- | --- | --- |
| 1. | KAg(CN)$_2$: 5 to 15 g/L; and KAu(CN)$_2$: 5 to 15 g/L; and Oxalate-containing solution: 2-5 ml/L | 6.5-7.0 | 0.15-0.50 | 40-50 |
| 2. | KAg(CN)$_2$: 5 to 15 g/L; and K$_2$Pd(CN)$_4$: 5 to 15 g/L; and Oxalate-containing solution: 2-5 ml/L | 6.5-7.0 | 0.15-0.50 | 40-50 |
| 3. | KAg(CN)$_2$: 5 to 15 g/L; and K$_2$Pd(CN)$_4$: 5 to 15 g/L; and KAu(CN)$_2$: 5 to 15 g/L; and Oxalate-containing solution: 2-5 ml/L | 6.5-7.0 | 0.15-0.50 | 40-50 |

Embodiment 1

Embodiment 1 provides a method for manufacturing a semiconductor structure 20 shown in FIG. 3 having a $Ag_{1-x}Au_x$ alloy bump body 101 with X being in a range of from about 0.01 to about 0.1. The operations adopted in manufacturing the semiconductor structure 20 can be referred to FIGS. 13, 14, 15, 16, 17, and 18 as previously discussed in the present disclosure. In FIG. 13, a UBM layer 104 is formed on the passivation layer 193 and a portion for the conductive pad 102, which are formed on a device 100. In Embodiment 1, the device 100 includes a semiconductor die. In FIG. 14, the seed layer 105 is formed over the UBM layer 104. In FIG. 15, a first mask layer 109 is patterned over the seed layer 105 and several openings 109A are defined in the first mask layer 109. In Embodiment 1, the openings 109A are positioned over the conductive pad 102. FIG. 16 illustrates the formation of a silver alloy bump body 101 in the first mask layer 109 by an electroplating operation.

In the container 100' shown in FIG. 16, a wafer pad including semiconductor dies is immersed into a first cyanide-based bath as a cathode, whereas a Pt-coated Ti is positioned as an anode in the electroplating operation. In Embodiment 1, the first cyanide-based bath includes 5 to 15 g/L of KAg(CN)$_2$ and the salts thereof, as well as 5 to 15 g/L of KAu(CN)$_2$ and the salts thereof. In Embodiment 1, the first cyanide-based bath constitutes about 10 wt % to about 60 wt % of KAu(CN)$_2$ in the total salts added therein with the balance being KAg(CN)$_2$ salts.

In Embodiment 1, leveling agents such as 2 to 5 ml/L of oxalate-containing solution can be added to the first cyanide-based bath to promote the electroplating reaction. The pH value of the first cyanide-based bath is controlled to be within a range of from about 6.5 to 7, and an electroplating current density of from about 0.15 to about 0.5 ASD is applied. In Embodiment 1, a temperature of the first cyanide-based bath is maintained at from about 40 to about 50 degrees Celsius. As shown in FIG. 18, after the formation of the silver alloy bump body 101 in the first cyanide-based bath, the first mask layer 109 and the portion of the seed layer 105 not covered by the silver alloy bump body 101 are removed. The silver alloy bump body 101 is then annealed under a temperature of from about 200 to about 300 degrees Celsius for a duration of from about 30 to about 60 minutes.

After forming the silver alloy bump body 101 in Embodiment 1, the silver alloy bump body 101 can be further attached to a flexible film 301 to form a chip-on-film (COF) semiconductor structure as shown in FIG. 4 by a bonding operation. An appropriate heat source shall be applied at the device 100 end that allows a junction between the silver alloy bump body 101 and the solder layer 306 to be at or greater than a Sn—Ag eutectic temperature (about 220° C.). Because a melting point of Ag is lower than that of Au, an annealing temperature used for the silver alloy bump body 101 in a COF semiconductor structure can be controlled at only about 200 to about 300 degrees Celsius for a duration of from about 30 to about 60 minutes. In addition, an anisotropic conductive film (ACF) can be used to bond the silver alloy bump body 101 and the flexible film 301 other than using a solder joint operation.

After forming the silver alloy bump body 101 in Embodiment 1, the silver alloy bump body 101 can be further attached to a glass substrate 401 to form a chip-on-glass (COG) semiconductor structure as shown in FIG. 10 by a bonding operation. An anisotropic conductive film (ACF) can be used to bond the silver alloy bump body 101 and the glass substrate 401.

Embodiment 2

Embodiment 2 provides a method for manufacturing a semiconductor structure 20 shown in FIG. 3 having a $Ag_{1-x}Pd_x$ alloy bump body 101 with X being in a range of from about 0.01 to about 0.1. The operations adopted in manufacturing the semiconductor structure 20 can be referred to FIGS. 13, 14, 15, 16, 17, and 18 as previously discussed in the present disclosure. Except for the content of the first cyanide-based bath, other manufacturing operations in Embodiment 2 can be referred to those described in Embodiment 1.

In the container 100' shown in FIG. 16, a wafer pad including semiconductor dies is immersed into a first cyanide-based bath as a cathode, whereas a Pt-coated Ti is positioned as an anode in the electroplating operation. In Embodiment 2, the first cyanide-based bath includes 5 to 15 g/L of KAg(CN)$_2$ and the salts thereof, as well as 5 to 15 g/L of K$_2$Pd(CN)$_4$ and the salts thereof. In Embodiment 2, the first cyanide-based bath constitutes about 10 wt % to about 30 wt % of K$_2$Pd(CN)$_4$ in the total salts added therein with the balance being KAg(CN)$_2$ salts.

Embodiment 3

Embodiment 3 provides a method for manufacturing a semiconductor structure 20 shown in FIG. 3 having a $Ag_{1-x}(AuPd)_x$ alloy bump body 101 with X being in a range of from about 0.01 to about 0.1. The operations adopted in manufacturing the semiconductor structure 20 can be referred to FIGS. 13, 14, 15, 16, 17, and 18 as previously discussed in the present disclosure. Except for the content of the first cyanide-based bath, other manufacturing operations in Embodiment 3 can be referred to those described in Embodiment 1 and Embodiment 2.

In the container 100' shown in FIG. 16, a wafer pad including semiconductor dies is immersed into a first cyanide-based bath as a cathode, whereas a Pt-coated Ti is positioned as an anode in the electroplating operation. In Embodiment 3, the first cyanide-based bath includes 5 to 15 g/L of KAg(CN)$_2$, 5 to 15 g/L of K$_2$Pd(CN)$_4$, as well as 5 to 15 g/L of KAu(CN)$_2$ and the salts thereof. In Embodiment 3, the first cyanide-based bath constitutes about 10 wt % to about 30 wt % of $K_2Pd(CN)_4$ and about 10 wt % to about 60 wt % of $KAu(CN)_2$ in the total salts added therein with the balance being $KAg(CN)_2$ salts.

Figure 19:
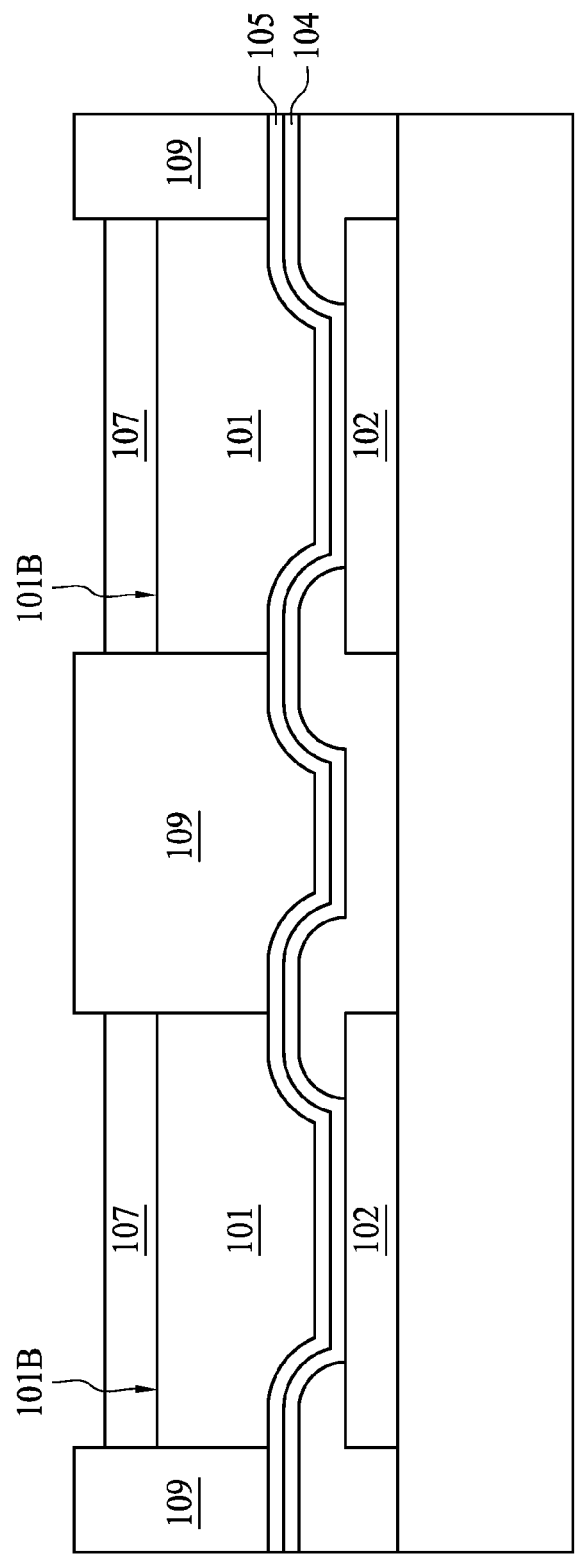
Figure 20:
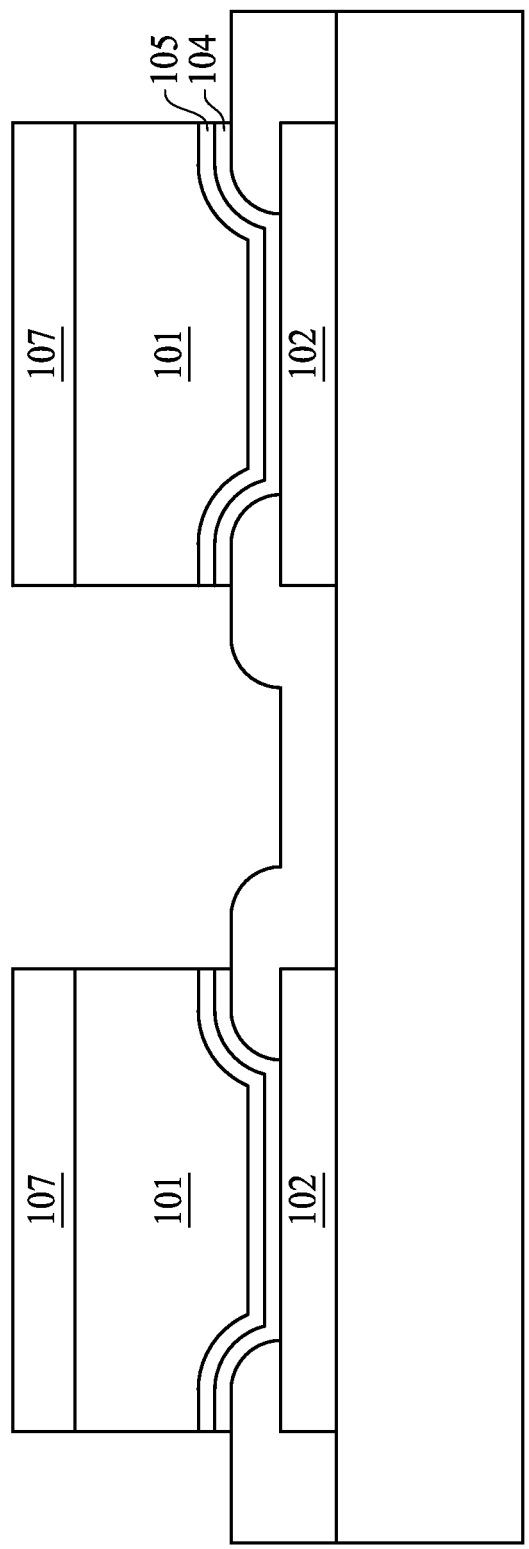

FIG. 17, FIG. 19, and FIG. 20 refer to manufacturing steps of a multilayer bump structure. In some embodiments, after removing from the electroplating bath shown in FIG. 16 and before the stripping of the photoresist, the wafer pad is then immersed into another electroplating bath containing KAu$(CN)_2$ and its salts. As shown in FIG. 19, the metal layer 107 is formed on a top surface 101B of the silver alloy bump body 101. In FIG. 20, the first mask layer 109 is stripped if a photoresist is used. The UBM layer 104 and the seed layer 105 not covered by the silver alloy bump body 101 are removed by an etching operation to isolate two multilayer alloy bumps.

thereof, as well as 5 to 15 g/L of $K_2Pd(CN)_4$ and the salts thereof. In Embodiment 4, the first cyanide-based bath constitutes about 10 wt % to about 30 wt % of $K_2Pd(CN)_4$ in the total salts added therein with the balance being $KAg(CN)_2$ salts. Similarly, in Embodiment 4, the first cyanide-based bath can include 5 to 15 g/L of $KAg(CN)_2$ and the salts thereof, 5 to 15 g/L of $K_2Pd(CN)_4$ and the salts thereof, as well as 5 to 15 g/L of $KAu(CN)_2$ and the salts thereof. In Embodiment 4, the first cyanide-based bath constitutes about 10 wt % to about 30 wt % of $K_2Pd(CN)_4$, and about 10 wt % to about 60 wt % of $KAu(CN)_2$ in the total salts added therein with the balance being $KAg(CN)_2$ salts.

In Embodiment 4, leveling agents such as 2 to 5 ml/L of oxalate-containing solution can be added to the first cyanide-based bath to promote the electroplating reaction. The pH value of the first cyanide-based bath is controlled to be within

| Embodiment No. | First Cyanide-Based Bath | pH | J (ASD) | Temperature (° C.) | Second Cyanide-Based Bath/ Electroless Plating Bath | pH | J (ASD) | Temperature (° C.) |
|---|---|---|---|---|---|---|---|---|
| 4. | $KAg(CN)_2$: 5 to 15 g/L; and $K_2Pd(CN)_4$: 5 to 15 g/L; and/or $KAu(CN)_2$: 5 to 15 g/L; and Oxalate-containing solution: 2-5 ml/L | 6.5-7.0 | 0.15-0.50 | 40-50 | $KAu(CN)_2$: 5 to 15 g/L; and Oxalate-containing solution: 2-5 ml/L | 6.5-7.0 | 0.15-0.50 | 40-45 |
| 5. | $KAg(CN)_2$: 5 to 15 g/L; and $K_2Pd(CN)_4$: 5 to 15 g/L; and/or $KAu(CN)_2$: 5 to 15 g/L; and Oxalate-containing solution: 2-5 ml/L | 6.5-7.0 | 0.15-0.50 | 40-50 | $KAu(CN)_2$: 5 to 15 g/L; and Oxalate-containing solution: 2-5 ml/L | 6.5-7.0 | 0.15-0.50 | 40-45 |
| 6. | $KAg(CN)_2$: 5 to 15 g/L; and $K_2Pd(CN)_4$: 5 to 15 g/L; and/or $KAu(CN)_2$: 5 to 15 g/L; and Oxalate-containing solution: 2-5 ml/L | 6.5-7.0 | 0.15-0.50 | 40-50 | $KAu(CN)_2$: 10 to 20 g/L | 4.5-6.5 | n/a | 80-90 |

Embodiment 4

Embodiment 4 provides an electroplating method for manufacturing a multilayer bump structure 40 shown in FIG. 6 having a $Ag_{1-x}Au_x$, a $Ag_{1-x}Pd_x$, or a $Ag_{1-x}(AuPd)_x$ alloy bump body 101 with X being in a range of from about 0.01 to about 0.1 and a metal layer 107 only on a top surface of the silver alloy bump body 101. The operations adopted in manufacturing the multilayer bump structure 40 can be referred to FIGS. 13, 14, 15, 16, 17, 19 and 20 as previously discussed in the present disclosure. In FIG. 13, a UBM layer 104 is formed on the passivation layer 193 and a portion for the conductive pad 102, which are formed on a device 100. In Embodiment 1, the device 100 includes a semiconductor die. In FIG. 14, the seed layer 105 is formed over the UBM layer 104. In FIG. 15, a first mask layer 109 is patterned over the seed layer 105 and several openings 109A are defined in the first mask layer 109. In Embodiment 4, the openings 109A are positioned over the conductive pad 102. FIG. 16 illustrates the formation of a silver alloy bump body 101 in the first mask layer 109 by an electroplating operation.

In the container 100' shown in FIG. 16, a wafer pad including semiconductor dies is immersed into a first cyanide-based bath as a cathode, whereas a Pt-coated Ti is positioned as an anode in the electroplating operation. In Embodiment 4, the first cyanide-based bath can include 5 to 15 g/L of $KAg(CN)_2$ and the salts thereof, as well as 5 to 15 g/L of $KAu(CN)_2$ and the salts thereof. In Embodiment 4, the first cyanide-based bath constitutes about 10 wt % to about 60 wt % of $KAu(CN)_2$ in the total salts added therein with the balance being $KAg(CN)_2$ salts. Similarly, in Embodiment 4, the first cyanide-based bath can include 5 to 15 g/L of $KAg(CN)_2$ and the salts a range of from about 6.5 to 7, and an electroplating current density of from about 0.15 to about 0.5 ASD is applied. In Embodiment 4, a temperature of the first cyanide-based bath is maintained from about 40 to about 50 degrees Celsius.

In Embodiment 4, after the formation of the silver alloy bump body 101, the wafer pad is then immersed into a second cyanide-based bath including 5 to 15 g/L of $KAu(CN)_2$ and the salts thereof. Leveling agents such as 2 to 5 ml/L of oxalate-containing solution can be added to the second cyanide-based bath to promote the electroplating reaction. The pH value of the second cyanide-based bath is controlled to be within a range of from about 6.5 to 7, and an electroplating current density of from about 0.15 to about 0.5 ASD is applied. In Embodiment 4, a temperature of the second cyanide-based bath is maintained in a range of from about 40 to about 45 degrees Celsius.

As shown in FIG. 19 and FIG. 20, after the formation of the multilayer bump structure (101, 107) in the second cyanide-based bath, the first mask layer 109 and the portion of the seed layer 105 not covered by the multilayer bump structure (101, 107) are removed. The multilayer bump structure (101, 107) is then annealed under a temperature of from about 200 to about 300 degrees Celsius for a duration of from about 30 to about 60 minutes.

After forming the multilayer bump structure (101, 107) in Embodiment 4, the silver alloy bump body 101 can be further attached to a flexible film 301 to form a chip-on-film (COF) semiconductor structure 50 as shown in FIG. 7 by a bonding operation. An appropriate heat source shall be applied at the device 100 end that allows a junction between the metal layer 107 on the top surface of the multilayer bump structure (101, 107) and the solder layer 308 to be at or greater than a Sn—Au eutectic temperature (about 215° C.). In addition, an anisotropic conductive film (ACF) can be used to bond the multilayer bump structure (101, 107) and the flexible film 301 other than using a solder joint operation.

After forming the multilayer bump structure (101, 107) in Embodiment 4, the multilayer bump structure (101, 107) can be further attached to a glass substrate 401 to form a chip-on-glass (COG) semiconductor structure 80 as shown in FIG. 11 by a bonding operation. An anisotropic conductive film (ACF) 406 can be used to bond multilayer bump structure (101, 107) and the glass substrate 401.

Figure 21:
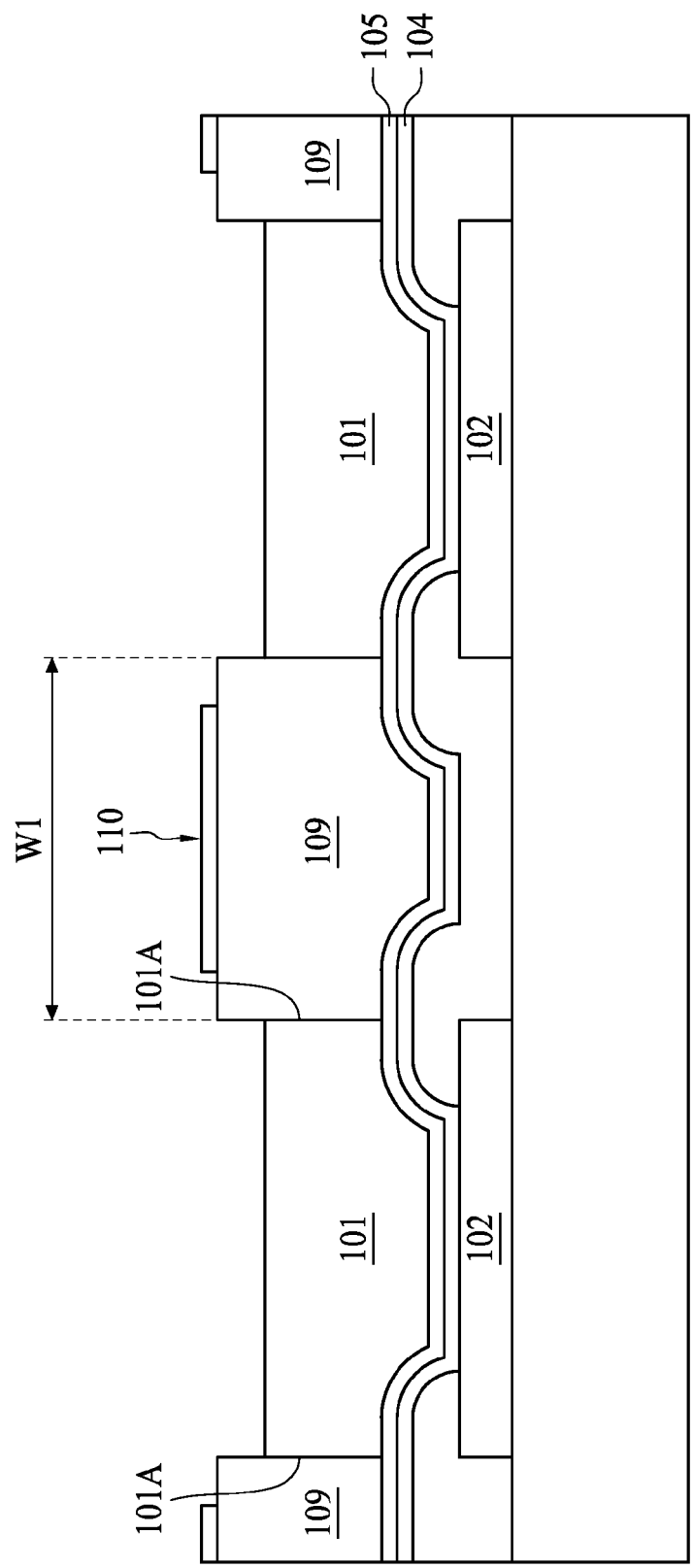
Figure 22:
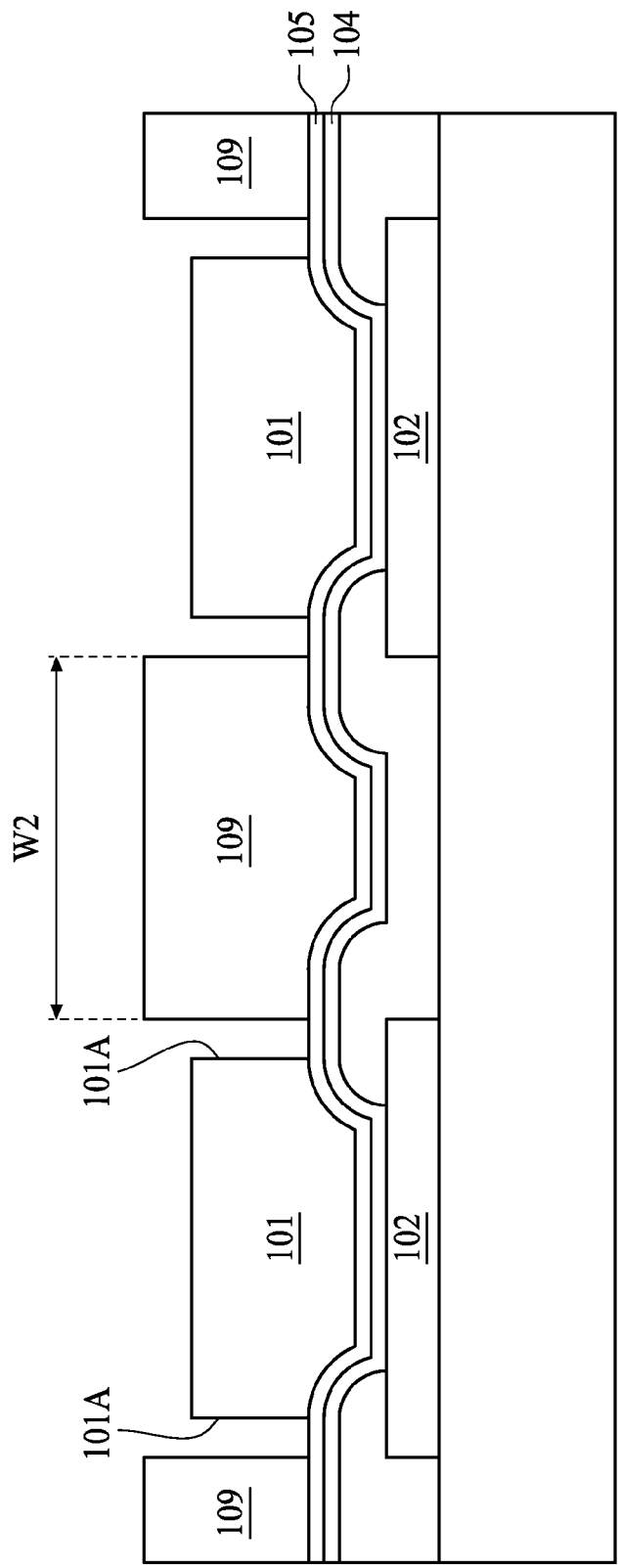

FIG. 17, FIG. 21 to FIG. 24, and FIG. 26 refer to manufacturing steps of a multilayer bump structure. In some embodiments, an electroplating operation is used to form the multilayer bump structure. After removing from the electroplating bath shown in FIG. 16 and before the stripping of the photoresist, a second mask layer 110 is formed on the first mask layer 109 to trim down a first width W1 of the first mask layer 109. In some embodiments, the first width W1 of the first mask layer 109 is wide enough to form physical contact to a sidewall 101A of the plated silver alloy bump body 101. In FIG. 21 and FIG. 22, the first mask layer 109 is transformed into a second width W2 via a partial stripping operation. In some embodiments, the portion not covered by the second hard mask layer 110 is removed in the stripping operation and a reduced second width W2 thereof is obtained. In some embodiments, the second width W2 of the second mask layer 110 is narrow enough to form a gap between itself and the sidewall 101A of the plated silver alloy bump body 101.

Figure 23:
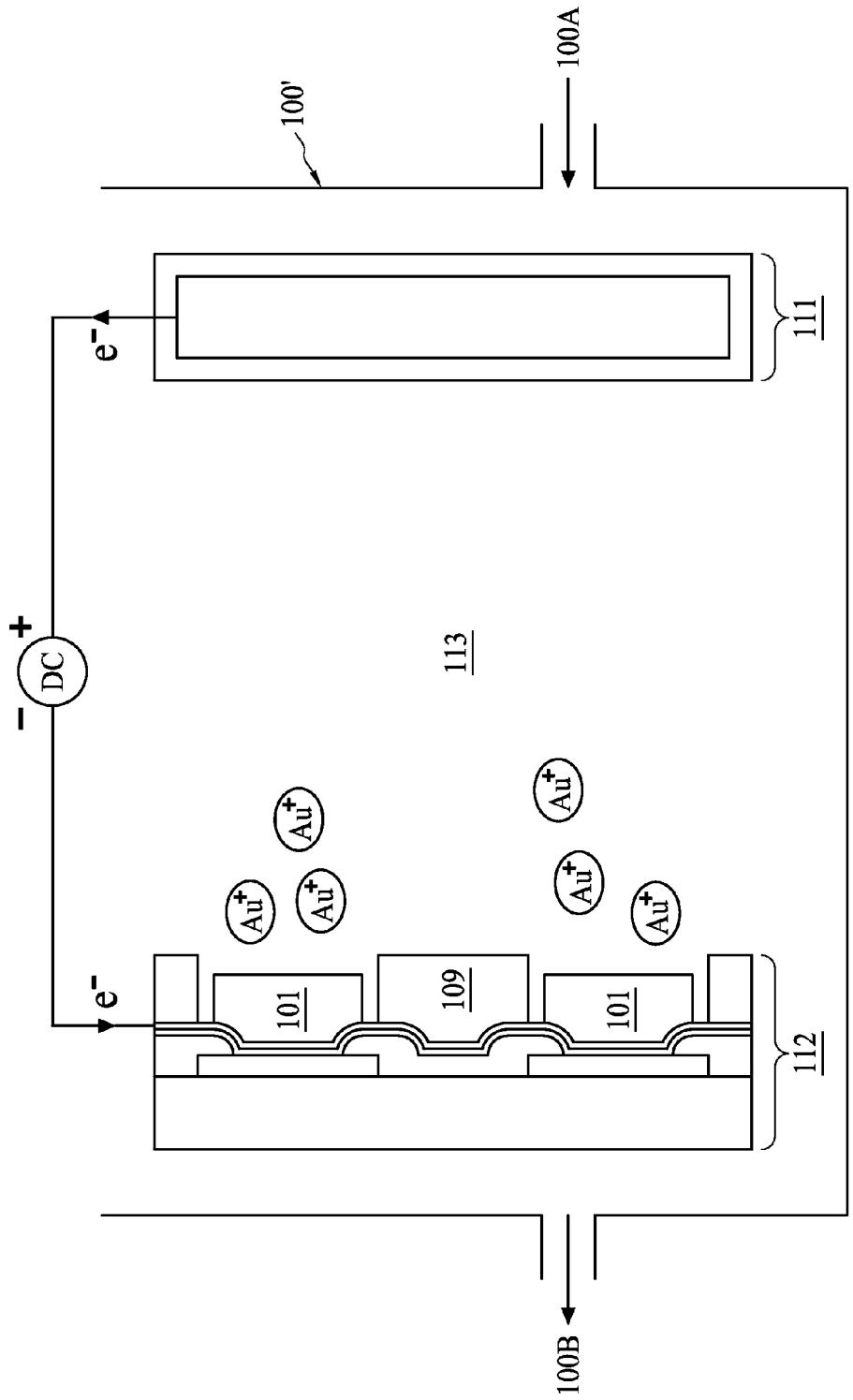

FIG. 23 shows an electroplating system which includes a container 100' accommodating electroplating bath 113, an anode 111, and a cathode 112. In some embodiments, the anode 111 is insoluble and can be made of platinum-coated titanium, the wafer pad deposited with a proper seed layer is positioned at the cathode 112, and the electroplating bath 113 contains cyanide-base plating solution including $KAu(CN)_2$, and its salts. In some embodiments, the pH value of the electroplating bath 113 is controlled around neutral, for example, from about 6 to about 8. A temperature of the electroplating bath 113 is controlled to be around 40 to 50 degrees Celsius. In some embodiments, the temperature of the electroplating bath 113 can be maintained by a thermal plate (not shown) positioned under the container 100'. In other embodiments, the temperature of the electroplating bath 113 can be maintained by an electroplating solution circulation system in which an outlet 100B discharges the electroplating solution and an inlet 100A intakes the temperature-controlled electroplating solution. Appropriate leveling agents including oxalate can be added to the electroplating bath 113 with a concentration of from about 2 ml/L to about 5 ml/L. In some embodiments, a current density of a direct current (DC) applied for silver alloy conductive bump plating is in a range of from about 0.1 ASD to about 0.5 ASD.

Figure 24:
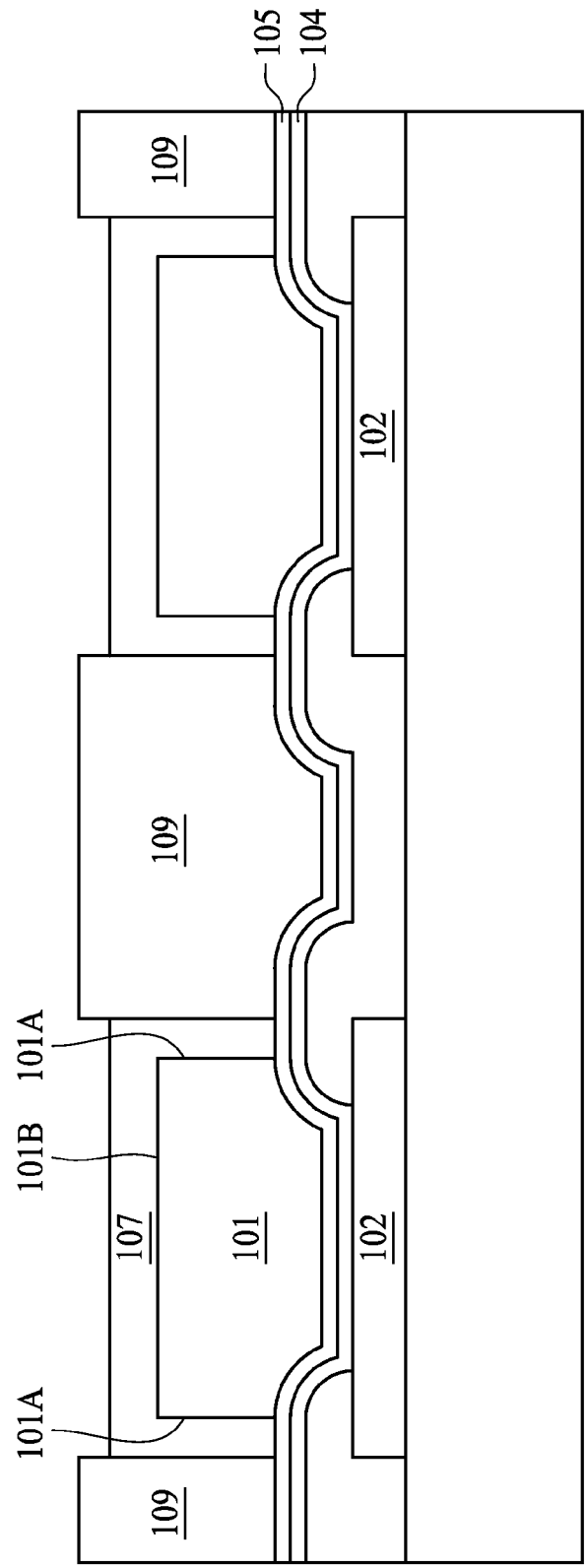

FIG. 24 shows the wafer pad taken out from the electroplating bath 113 after the electroplating operation in FIG. 23. The gold ion reacts with the silver alloy bump body 101 at it surface, which includes the top surface 101B and the sidewall 101A of the silver alloy bump body 101, and forms a metal layer 107 covering both the top surface 101B and the sidewall 101A of the silver alloy bump body 101. However, in some embodiments, a thickness of the metal layer 107 at the top surface 101B is different from a thickness of the metal layer 107 at the sidewall 101A of the silver alloy bump body 101. In other embodiments, a thickness of the metal layer 107 at the top surface 101B is greater than the thickness of the metal layer 107 at the sidewall 101A of the silver alloy bump body 101.

Figure 26:
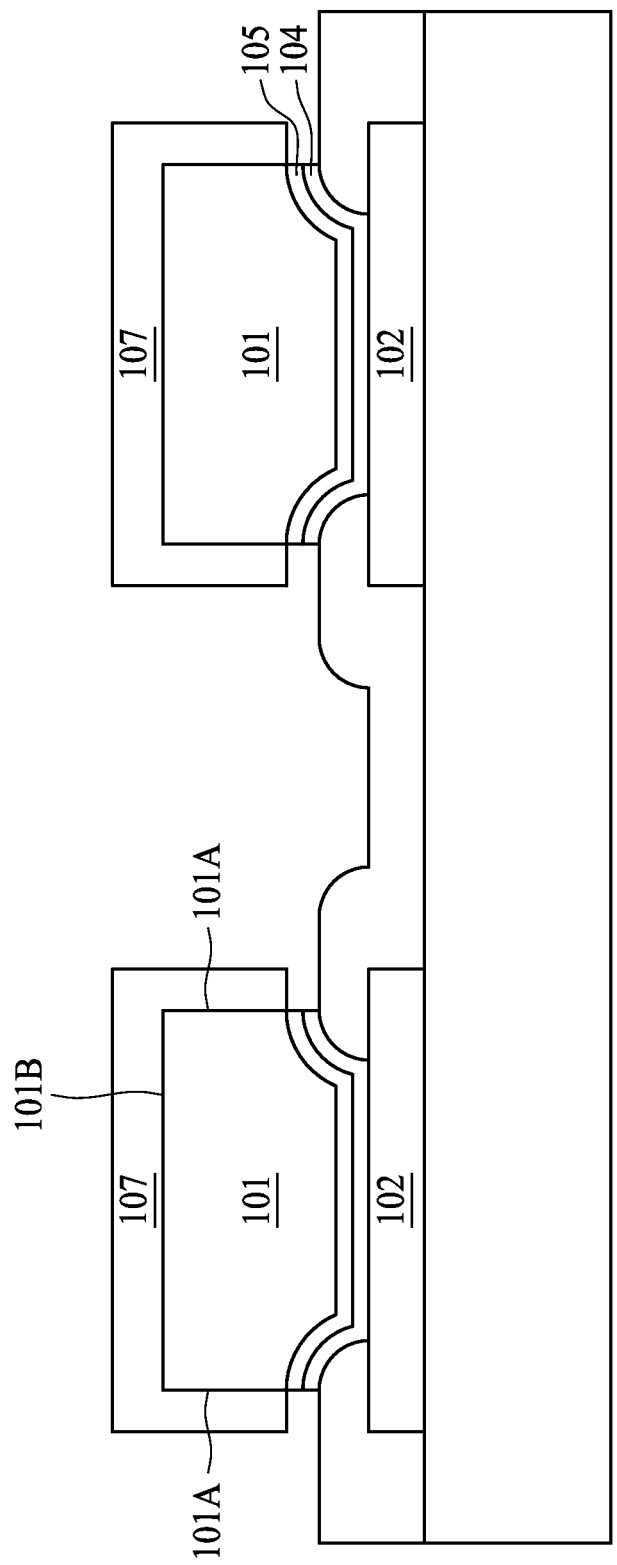

In FIG. 26, the first mask layer 109, as well as the UBM layer 104 and the seed layer 105 not covered by the silver alloy bump body 101 are removed by a stripping and an etching operation to isolate two multilayer alloy bumps.

Embodiment 5

Embodiment 5 provides an electroplating method for manufacturing a is multilayer bump structure having a $Ag_{1-x}Au_x$, a $Ag_{1-x}Pd_x$, or a $Ag_{1-x}(AuPd)_x$ alloy bump body 101 with X being in a range of from about 0.01 to about 0.1 and a metal layer 107 not only on a top surface but also at a sidewall of the silver alloy bump body 101. The operations adopted in manufacturing the multilayer bump structure 40 can be referred to FIGS. 13, 14, 15, 16, 17, 21, 22, 23, 24, and 26 as previously discussed in the present disclosure. In FIG. 13, a UBM layer 104 is formed on the passivation layer 193 and a portion for the conductive pad 102, which are formed on a device 100. In Embodiment 1, the device 100 includes a semiconductor die. In FIG. 14, the seed layer 105 is formed over the UBM layer 104. In FIG. 15, a first mask layer 109 is patterned over the seed layer 105 and several openings 109A are defined in the first mask layer 109. In Embodiment 5, the openings 109A are positioned over the conductive pad 102. FIG. 16 illustrates the formation of a silver alloy bump body 101 in the first mask layer 109 by an electroplating operation.

In the container 100' shown in FIG. 16, a wafer pad including semiconductor dies is immersed into a first cyanide-based bath as a cathode, whereas a Pt-coated Ti is positioned as an anode in the electroplating operation. In Embodiment 5, the first cyanide-based bath can include 5 to 15 g/L of $KAg(CN)_2$ and the salts thereof, as well as 5 to 15 g/L of $KAu(CN)_2$ and the salts thereof. In Embodiment 5, the first cyanide-based bath constitutes about 10 wt % to about 60 wt % of $KAu(CN)_2$ in the total salts added therein with the balance being $KAg(CN)_2$ salts. Similarly, in Embodiment 5, the first cyanide-based bath can include 5 to 15 g/L of $KAg(CN)_2$ and the salts thereof, as well as 5 to 15 g/L of $K_2Pd(CN)_4$ and the salts thereof. In Embodiment 5, the first cyanide-based bath constitutes about 10 wt % to about 30 wt % of $K_2Pd(CN)_4$ in the total salts added therein with the balance being $KAg(CN)_2$ salts. Similarly, in Embodiment 5, the first cyanide-based bath can include 5 to 15 g/L of $KAg(CN)_2$ and the salts thereof, 5 to 15 g/L of $K_2Pd(CN)_4$ and the salts thereof, as well as 5 to 15 g/L of $KAu(CN)_2$ and the salts thereof. In Embodiment 5, the first cyanide-based bath constitutes about 10 wt % to about 30 wt % of $K_2Pd(CN)_4$, and about 10 wt % to about 60 wt % of $KAu(CN)_2$ in the total salts added therein with the balance being $KAg(CN)_2$ salts.

In Embodiment 5, leveling agents such as 2 to 5 ml/L of oxalate-containing solution can be added to the first cyanide-based bath to promote the electroplating reaction. The pH value of the first cyanide-based bath is controlled to be within a range of from about 6.5 to 7, and an electroplating current density of from about 0.15 to about 0.5 ASD is applied. In Embodiment 5, a temperature of the first cyanide-based bath is maintained from about 40 to about 50 degrees Celsius.

In Embodiment 5, a trimmed first mask layer 109 with a width W2 is formed over the seed layer 105, forming a gap between the trimmed first mask layer 109 and the silver alloy bump body 101. Because the width W2 of the trimmed first mask layer 109 is shorter than the width W1 of the first mask layer 109, the formation of the trimmed first mask layer 109 can be carried out via a lithography operation as shown in FIG. 21 and FIG. 22. A second mask layer 110 shown in FIG. 21 is used to define the degree of trimming (i.e. the difference between W1 and W2) of the trimmed first mask layer 109. In Embodiment 5, after the formation of the silver alloy bump body 101 and the trimmed first mask layer 109, the wafer pad is then immersed into a second cyanide-based bath including 5 to 15 g/L of KAu(CN)$_2$ and the salts thereof. Leveling agents such as 2 to 5 ml/L of oxalate-containing solution can be added to the second cyanide-based bath to promote the electroplating reaction. The pH value of the second cyanide-based bath is controlled to be within a range of from about 6.5 to 7, and an electroplating current density of from about 0.15 to about 0.5 ASD is applied. In Embodiment 5, a temperature of the second cyanide-based bath is maintained in a range of from about 40 to about 45 degrees Celsius.

As shown in FIG. 24 and FIG. 26, after the formation of the multilayer bump structure (101, 107) in the second cyanide-based bath, the trimmed first mask layer 109 and the portion of the seed layer 105 not covered by the multilayer bump structure (101, 107) are removed. The multilayer bump structure (101, 107) is then annealed under a temperature of from about 200 to about 300 degrees Celsius for a duration of from about 30 to about 60 minutes.

After forming the multilayer bump structure (101, 107) in Embodiment 5, the silver multilayer bump structure (101, 107) can be further attached to a flexible film 301 to form a chip-on-film (COF) semiconductor structure 60 as shown in FIG. 8 by a bonding operation. An appropriate heat source shall be applied at the device 100 end that allows a junction between the metal layer 107 on the top surface of the multi-layer bump structure (101, 107) and the solder layer 308 to be at or greater than a Sn—Au eutectic temperature (about is 215° C.). In addition, an anisotropic conductive film (ACF) can be used to bond the multilayer bump structure (101, 107) and the flexible film 301 other than using a solder joint operation.

After forming the multilayer bump structure (101, 107) in Embodiment 5, the multilayer bump structure (101, 107) can be further attached to a glass substrate 401 to form a chip-on-glass (COG) semiconductor structure 90 as shown in FIG. 12 by a bonding operation. An anisotropic conductive film (ACF) 406 can be used to bond the multilayer bump structure (101, 107) and the glass substrate 401.

Figure 25:
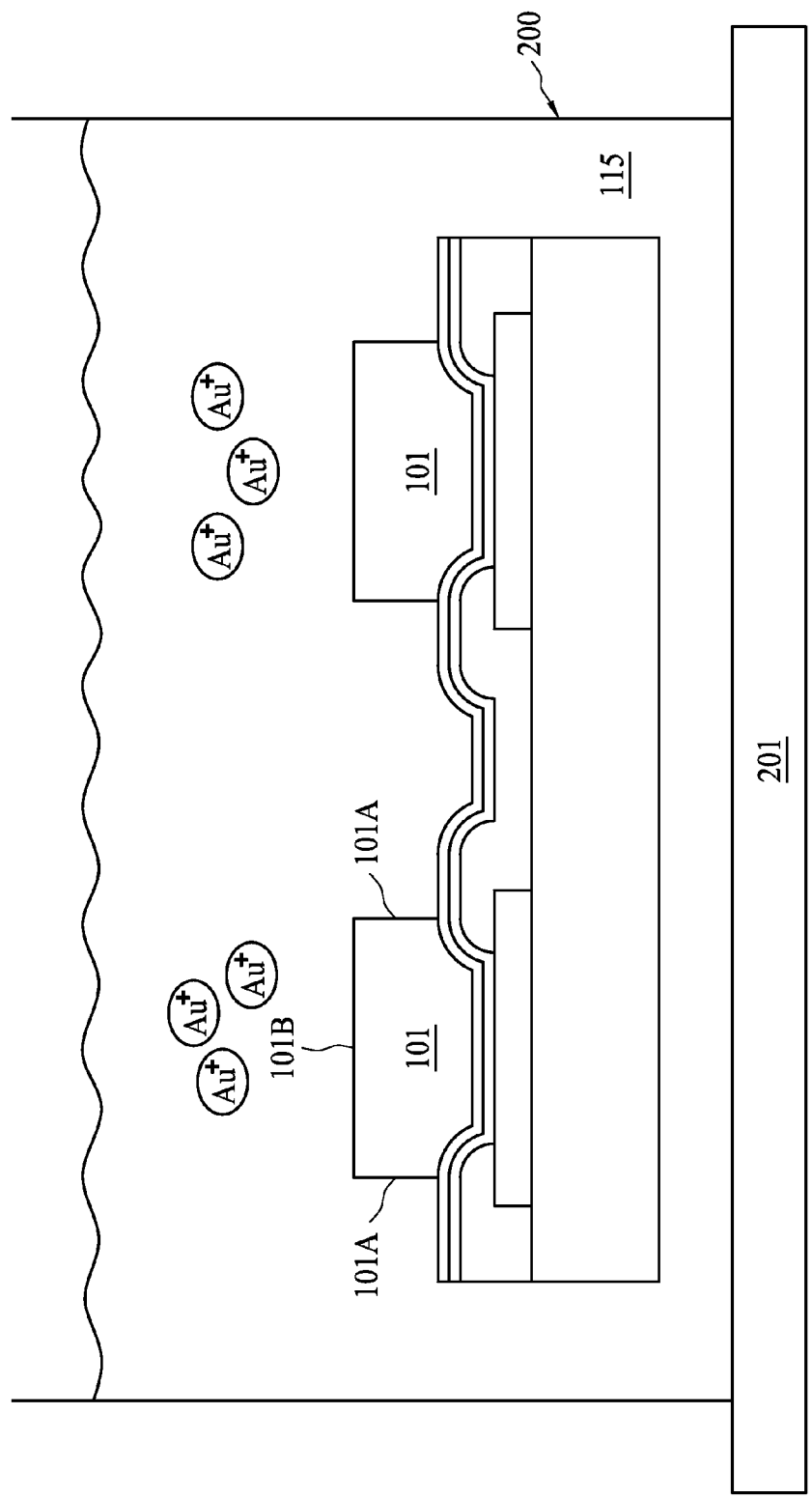

FIG. 17, FIG. 25, and FIG. 26 refer to manufacturing steps of a multilayer bump structure. In some embodiments, an electroless plating operation is used to form the multilayer bump structure. After a removal of the first mask layer 109, the UBM layer 104 and the seed layer 105 originally covered by the first mask layer 109 are then exposed. FIG. 25 shows a container 200 accommodating electroless plating bath 115. The wafer pad after the first mask layer 109 stripping is immersed into the electroless plating bath 115 containing cyanide-base plating solution such as KAu(CN)$_2$ and its salts. In some embodiments, the pH value of the electroless plating bath 115 is controlled around neutral, for example, from about 6 to about 8. A temperature of the electroless plating bath 115 is controlled to be around 40 to 50 degrees Celsius. In some embodiments, the temperature of the electroless plating bath 115 can be maintained by a thermal plate 201 positioned under the container 200. In other embodiments, the temperature of the electroless plating bath 115 can be maintained by an electroless plating solution circulation system (not shown) in which an outlet discharges the electroless plating solution and an inlet intakes the temperature-controlled electroless plating solution. Appropriate leveling agents including oxalate and its salts can be added to the electroless plating bath 115 with a concentration of from about 2 ml/L to about 5 ml/L. As shown in FIG. 25 and FIG. 26, the gold ion reacts with the silver alloy bump body 101 at it surface, which includes the top surface 101B and the side-wall 101A of the silver alloy bump body 101, and forms a metal layer 107 covering both the top surface 101B and the sidewall 101A of the silver alloy bump body 101. However, in some embodiments, a thickness of the metal layer 107 at the top surface 101B is comparable to a thickness of the metal layer 107 at the sidewall 101A of the silver alloy bump body 101. In other embodiments, a thickness uniformity of the metal layer 107 prepared by an electroless plating operation is better than is that of the metal layer 107 prepared by an electroplating operation.

FIG. 26 shows the wafer pad in FIG. 25 but after the removal of the UBM layer 104 and the seed layer 105 not covered by the silver alloy bump body 101.

Embodiment 6

Embodiment 6 provides an electroless plating method for manufacturing the metal layer 107 in a multilayer bump structure having a $Ag_{1-x}Au_x$, a $Ag_{1-x}Pd_x$, or a $Ag_{1-x}(AuPd)_x$ alloy bump body 101 with X being in a range of from about 0.01 to about 0.1 and a metal layer 107 not only on a top surface but also at a sidewall of the silver alloy bump body 101. The operations adopted in manufacturing the multilayer bump structure 40 can be referred to FIGS. 13, 14, 15, 16, 17, 25 and 26 as previously discussed in the present disclosure. In FIG. 13, a UBM layer 104 is formed on the passivation layer 193 and a portion of the conductive pad 102, which are formed on a device 100. In Embodiment 1, the device 100 includes a semiconductor die. In FIG. 14, the seed layer 105 is formed over the UBM layer 104. In FIG. 15, a first mask layer 109 is patterned over the seed layer 105 and several openings 109A are defined in the first mask layer 109. In Embodiment 6, the openings 109A are positioned over the conductive pad 102. FIG. 16 illustrates the formation of a silver alloy bump body 101 in the first mask layer 109 by an electroplating operation.

In the container 100' shown in FIG. 16, a wafer pad including semiconductor dies is immersed into a first cyanide-based bath as a cathode, whereas a Pt-coated Ti is positioned as an anode in the electroplating operation. In Embodiment 6, the first cyanide-based bath can include 5 to 15 g/L of KAg(CN)$_2$ and the salts thereof, as well as 5 to 15 g/L of KAu(CN)$_2$ and the salts thereof. In Embodiment 6, the first cyanide-based bath constitutes about 10 wt % to about 60 wt % of KAu(CN)$_2$ in the total salts added therein with the balance being KAg (CN)$_2$ salts. Similarly, in Embodiment 6, the first cyanide-based bath can include 5 to 15 g/L of KAg(CN)$_2$ and the salts thereof, as well as 5 to 15 g/L of K$_2$Pd(CN)$_4$ and the salts thereof. In Embodiment 6, the first cyanide-based bath constitutes about 10 wt % to about 30 wt % of K$_2$Pd(CN)$_4$ in the total salts added therein with the balance being KAg(CN)$_2$ salts. Similarly, in Embodiment 6, the first cyanide-based bath can include 5 to 15 g/L of KAg(CN)$_2$ and the salts thereof, 5 to 15 g/L of K$_2$Pd(CN)$_4$ and the salts thereof, as well as 5 to 15 g/L of KAu(CN)$_2$ and the salts thereof. In Embodiment 6, the first cyanide-based bath constitutes about 10 wt % to about 30 wt % of K$_2$Pd(CN)$_4$, and about is 10 wt % to about 60 wt % of KAu(CN)$_2$ in the total salts added therein with the balance being KAg(CN)$_2$ salts.

In Embodiment 6, leveling agents such as 2 to 5 ml/L of oxalate-containing solution can be added to the first cyanide-based bath to promote the electroplating reaction. The pH value of the first cyanide-based bath is controlled to be within a range of from about 6.5 to 7, and an electroplating current density of from about 0.15 to about 0.5 ASD is applied. In Embodiment 6, a temperature of the first cyanide-based bath is maintained from about 40 to about 50 degrees Celsius.

As shown in FIG. 17 and FIG. 25, after the formation of the silver alloy bump body 101, the first mask layer 109 is removed and the wafer pad is then immersed into an electroless plating bath 115 including 10 to 20 g/L of $KAu(CN)_2$ and the salts thereof. The pH value of the electroless plating bath 115 is controlled to be within a range of from about 4.5 to 6.5. In Embodiment 6, a temperature of the electroless plating bath 115 is maintained in a range of from about 80 to about 90 degrees Celsius.

As shown in FIG. 25 and FIG. 26, after the formation of the multilayer bump structure (101, 107) in the electroless plating bath 115, the portion of the seed layer 105 not covered by the multilayer bump structure (101, 107) are removed. The multilayer bump structure (101, 107) is then annealed under a temperature of from about 200 to about 300 degrees Celsius for a duration of from about 30 to about 60 minutes.

After forming the multilayer bump structure (101, 107) in Embodiment 6, the multilayer bump structure (101, 107) can be further attached to a flexible film 301 to form a chip-on-film (COF) semiconductor structure 60 as shown in FIG. 8 by a bonding operation. An appropriate heat source shall be applied at the device 100 end that allows a junction between the metal layer 107 on the top surface of the multilayer bump structure (101, 107) and the solder layer 308 to be at or greater than a Sn—Au eutectic temperature (about 215° C.). In addition, an anisotropic conductive film (ACF) can be used to bond the multilayer bump structure (101, 107) and the flexible film 301 other than using a solder joint operation.

After forming the multilayer bump structure (101, 107) in Embodiment 6, the multilayer bump structure (101, 107) can be further attached to a glass substrate 401 to form a chip-on-glass (COG) semiconductor structure 90 as shown in FIG. 12 by a bonding operation. An anisotropic conductive film (ACF) 406 can be used to bond the multilayer bump structure (101, 107) and the glass substrate 401.

Some embodiments of the present disclosure provide a method for manufacturing a semiconductor structure includes operations of forming a conductive pad on a semiconductor die; forming a seed layer over the conductive pad; defining a first mask layer over the seed layer; and forming a silver alloy bump body in the first mask layer. The operation of forming a silver alloy bump body in the first mask layer includes preparing a first cyanide-based bath; controlling a pH value of the first cyanide-based bath to be within a range of from about 6 to about 8; immersing the semiconductor die into the first cyanide-based bath; and applying an electroplating current density of from about 0.1 ASD to about 0.5 ASD to the semiconductor die.

In some embodiments of the present disclosure, a method for manufacturing a semiconductor structure further includes removing the first mask layer after the forming the silver alloy bump body in the first mask layer; and removing a portion of the seed layer not covered by the silver alloy bump body.

In some embodiments of the present disclosure, a preparation of the first cyanide-based bath in a method for manufacturing a semiconductor structure includes introducing oxalate and salts thereof with a concentration of from about 2 ml/L to about 5 ml/L into the first cyanide-based bath.

In some embodiments of the present disclosure, a preparation of the first cyanide-based bath in a method for manufacturing a semiconductor structure includes introducing KAg $(CN)_2$ and salts thereof into the first cyanide-based bath.

In some embodiments of the present disclosure, a preparation of the first cyanide-based bath in a method for manufacturing a semiconductor structure includes introducing KAu $(CN)_2$ and salts thereof into the first cyanide-based bath.

In some embodiments of the present disclosure, introducing $KAu(CN)_2$ and salts thereof into the first cyanide-based bath in a method for manufacturing a semiconductor structure includes controlling a concentration of $KAu(CN)_2$ within a range of from about 10 wt % to about 60 wt %.

In some embodiments of the present disclosure, a preparation of the first cyanide-based bath further includes introducing $K_2Pd(CN)_4$ and salts thereof into the first cyanide-based bath.

In some embodiments of the present disclosure, introducing $K_2Pd(CN)_4$ and salts thereof into the first cyanide-based bath includes controlling a concentration of $K_2Pd(CN)_4$ within a range of from about 10 wt % to about 30 wt %.

In some embodiments of the present disclosure, a method for manufacturing a semiconductor structure further includes annealing the silver alloy bump body under a temperature of from about 200 to about 300 degrees Celsius.

In some embodiments of the present disclosure, a method for manufacturing a semiconductor structure further includes annealing the silver alloy bump body for a duration of from about 30 to about 60 minutes.

In some embodiments of the present disclosure, a method for manufacturing a semiconductor structure further includes forming a metal layer over a top surface of the silver alloy bump body by an electroplating operation.

In some embodiments of the present disclosure, the method for manufacturing a semiconductor structure with a metal layer over a top surface of the silver alloy bump body by an electroplating operation includes immersing a semiconductor die into a second cyanide-based bath comprising $KAu(CN)_2$.

In some embodiments of the present disclosure, a method for manufacturing a semiconductor structure further includes forming a metal layer covering a top surface and a sidewall of the silver alloy bump body by an electroplating operation or an electroless plating operation.

In some embodiments of the present disclosure, forming the metal layer covering the top surface and the sidewall of the silver alloy bump body in a method for manufacturing a semiconductor structure includes forming a trimmed first mask layer over the seed layer; and forming the metal layer in the trimmed first mask layer.

In some embodiments of the present disclosure, forming a metal layer covering a top surface and a sidewall of the silver alloy bump body by an electroless plating operation includes immersing an semiconductor die into an electroless plating bath comprising $KAu(CN)_2$.

In some embodiments of the present disclosure, a method for manufacturing a semiconductor structure further includes controlling a temperature of the first cyanide-based bath within a range of from about 40 to about 50 degrees Celsius. Some embodiments of the present disclosure provide a method for manufacturing a chip-on-film (COF) semiconductor structure. The method includes forming a conductive pad on a semiconductor die; forming a seed layer over the conductive pad; forming a silver alloy bump body over the seed layer; and bonding the silver alloy bump body to a flexible film. The operation of forming a silver alloy bump body over the seed layer further includes preparing a cyanide-based bath comprising at least one of $KAu(CN)_2$, $KAg(CN)_2$, and $K_2Pd(CN)_4$ at a solution temperature of from about 40 to about 50 degrees Celsius; controlling a pH value of the cyanide-based bath within a range of from about 6 to about 8; and immersing the semiconductor die into the cyanide-based bath; and applying an electroplating current density of from about 0.1 ASD to about 0.5 ASD to the semiconductor die.

In some embodiments of the present disclosure, the bonding the silver alloy bump body to the flexible film in a method for manufacturing a COF semiconductor structure includes controlling a junction between the silver alloy bump body and a solder layer on the flexible film at or greater than a Sn—Ag eutectic temperature.

In some embodiments of the present disclosure, a method for manufacturing a COF semiconductor structure further includes annealing the silver alloy bump body under a temperature of from about 200 to about 300 degrees Celsius.

In some embodiments of the present disclosure, a method for manufacturing a COF semiconductor structure further includes annealing the silver alloy bump body for a duration of from about 30 to about 60 minutes.

In some embodiments of the present disclosure, bonding the silver alloy bump body to the flexible film in a method for manufacturing a COF semiconductor structure includes applying an anisotropic conductive film (ACF) between the silver alloy bump body and the flexible film.

In some embodiments of the present disclosure, a method for manufacturing a COF semiconductor structure further includes forming a metal layer over the silver alloy bump body by an electroplating operation or an electroless plating operation.

Some embodiments of the present disclosure provide a method for manufacturing a chip-on-glass (COG) semiconductor structure. The method includes forming a conductive pad on a semiconductor die; forming a seed layer over the conductive pad; forming a silver alloy bump body over the seed layer; and bonding the silver alloy bump body to a glass substrate. The forming a silver alloy bump body over the seed layer further includes preparing a cyanide-based bath comprising at least one of $KAu(CN)_2$, $KAg(CN)_2$, and $K_2Pd(CN)_4$; controlling a pH value of the cyanide-based bath is within a range of from about 6 to about 8; and immersing the semiconductor die into the cyanide-based bath; and applying an electroplating current density of from about 0.1 ASD to about 0.5 ASD to the semiconductor die.

In some embodiments of the present disclosure, a method for manufacturing a COG semiconductor structure includes controlling a concentration of $KAu(CN)_2$ within a range of from about 10 wt % to about 60 wt % in a cyanide-based bath.

In some embodiments of the present disclosure, a method for manufacturing a COG semiconductor structure includes controlling a concentration of $K_2Pd(CN)_4$ within a range of from about 10 wt % to about 30 wt %.

In some embodiments of the present disclosure, the bonding the silver alloy bump body to the glass substrate in a method for manufacturing a COG semiconductor structure includes applying anisotropic conductive film (ACF) between the silver alloy bump body and the glass substrate.

In some embodiments of the present disclosure, a method for manufacturing a COG semiconductor structure further includes forming a metal layer over the silver alloy bump body by an electroplating operation or an electroless plating operation.

In some embodiments of the present disclosure, forming the metal layer over is the silver alloy bump body by an electroless plating operation in a method for manufacturing a COG semiconductor structure includes preparing an electroless plating bath comprising $KAu(CN)_2$.

In some embodiments of the present disclosure, a method for manufacturing a COG semiconductor structure further includes controlling a temperature of the electroless plating bath within a range of from about 80 to about 90 degrees Celsius.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A method for manufacturing a semiconductor structure, comprising:
   forming a conductive pad on a semiconductor die;
   forming a seed layer over the conductive pad;
   defining a first mask layer over the seed layer; and
   forming a silver alloy bump body in the first mask layer, comprising:
   preparing a first cyanide-based bath;
   controlling a pH value of the first cyanide-based bath to be within a range of from about 6 to about 8;
   immersing the semiconductor die into the first cyanide-based bath; and
   applying an electroplating current density of from about 0.1 ASD to about 0.5 ASD to the semiconductor die,
   wherein the preparing the first cyanide-based bath comprises introducing $KAg(CN)_2$ and salts thereof into the first cyanide-based bath.

2. The method for manufacturing a semiconductor structure in claim 1, wherein the preparing the first cyanide-based bath further comprises introducing $KAu(CN)_2$ and salts thereof into the first cyanide-based bath.

3. The method for manufacturing a semiconductor structure in claim 2, wherein the introducing $KAu(CN)_2$ and salts thereof into the first cyanide-based bath comprises controlling a concentration of $KAu(CN)_2$ within a range of from about 10 wt % to about 60 wt %.

4. A method for manufacturing a semiconductor structure comprising:
   forming a conductive pad on a semiconductor die;
   forming a seed layer over the conductive pad;
   defining a first mask layer over the seed layer;
   forming a silver alloy bump body in the first mask layer, comprising:
   preparing a first cyanide-based bath;
   controlling a pH value of the first cyanide-based bath to be within a range of from about 6 to about 8;
   immersing the semiconductor die into the first cyanide-based bath; and
   applying an electroplating current density of from about 0.1 ASD to about 0.5 ASD to the semiconductor die; and
   forming a metal layer over a top surface of the silver alloy bump body by an electroplating operation,
   wherein the semiconductor die is immersed into a second cyanide-based bath comprising $KAu(CN)_2$.

5. A method for manufacturing a semiconductor structure comprising:
   forming a conductive pad on a semiconductor die;
   forming a seed layer over the conductive pad;
   defining a first mask layer over the seed layer;
   forming a silver alloy bump body in the first mask layer, comprising:

preparing a first cyanide-based bath;
controlling a pH value of the first cyanide-based bath to be within a range of from about 6 to about 8;
immersing the semiconductor die into the first cyanide-based bath; and
applying an electroplating current density of from about 0.1 ASD to about 0.5 ASD to the semiconductor die; and
forming a metal layer covering a top surface and a sidewall of the silver alloy bump body by an electroplating operation or an electroless plating operation,
wherein the forming the metal layer covering the top surface and the sidewall of the silver alloy bump body comprises:
forming a trimmed first mask layer over the seed layer; and
forming the metal layer in the trimmed first mask layer.

6. A method for manufacturing a semiconductor structure comprising:
forming a conductive pad on a semiconductor die;
forming a seed layer over the conductive pad;
defining a first mask layer over the seed layer;
forming a silver alloy bump body in the first mask layer, comprising:
preparing a first cyanide-based bath;
controlling a pH value of the first cyanide-based bath to be within a range of from about 6 to about 8;
immersing the semiconductor die into the first cyanide-based bath; and
applying an electroplating current density of from about 0.1 ASD to about 0.5 ASD to the semiconductor die; and
forming a metal layer covering a top surface and a sidewall of the silver alloy bump body by an electroplating operation or an electroless plating operation,
wherein the forming a metal layer covering a top surface and a sidewall of the silver alloy bump body by an electroless plating operation comprises immersing the semiconductor die into an electroless plating bath comprising $KAu(CN)_2$.

* * * * *